(12) United States Patent
Patankar et al.

(10) Patent No.: US 11,281,826 B2
(45) Date of Patent: Mar. 22, 2022

(54) SYSTEMS AND METHODS FOR COMPUTATIONAL SIMULATION OF SELF-PROPELLING VEHICLES FOR AERODYNAMIC DESIGN

(71) Applicant: Northwestern University, Evanston, IL (US)

(72) Inventors: Neelesh A. Patankar, Buffalo Grove, IL (US); Nishant Nangia, Vernon Hills, IL (US)

(73) Assignee: Northwestern University, Evanston, IL (US)

( * ) Notice: Subject to any disclaimer, the term of this patent is extended or adjusted under 35 U.S.C. 154(b) by 138 days.

(21) Appl. No.: 16/471,339

(22) PCT Filed: Dec. 20, 2017

(86) PCT No.: PCT/US2017/067649
§ 371 (c)(1),
(2) Date: Jun. 19, 2019

(87) PCT Pub. No.: WO2018/119104
PCT Pub. Date: Jun. 28, 2018

(65) Prior Publication Data
US 2020/0117842 A1    Apr. 16, 2020

Related U.S. Application Data

(60) Provisional application No. 62/437,216, filed on Dec. 21, 2016.

(51) Int. Cl.
*G06F 30/28*    (2020.01)
*G06F 30/15*    (2020.01)
(Continued)

(52) U.S. Cl.
CPC .......... *G06F 30/28* (2020.01); *G05D 1/0212* (2013.01); *G06F 30/15* (2020.01); *G06T 17/20* (2013.01)

(58) Field of Classification Search
CPC .......... G06F 30/28; G06F 30/15; G06F 30/20; G06F 30/25; G06F 30/27; G06F 2111/00;
(Continued)

(56) References Cited

U.S. PATENT DOCUMENTS

2008/0015825 A1*  1/2008  Kalitzin .................. G06F 30/23
703/2

OTHER PUBLICATIONS

Tristan Favre et al., "An Assessment of Detached-Eddy Simulations of Unsteady Crosswind Aerodynamics of Road Vechiles," Flow Turbulence Combust 87, pp. 133-163 (Year: 2011).*
(Continued)

*Primary Examiner* — Steven W Crabb
(74) *Attorney, Agent, or Firm* — Bell & Manning, LLC

(57) ABSTRACT

Systems, methods, and computer readable media to simulate and predict translational and/or rotational velocity of a moving vehicle based on a determination of engine load for the vehicle are disclosed. An example vehicle motion simulator system includes a speed and stability predictor to simulate and predict a translational and rotational velocity of a moving vehicle based on a determination of engine load for the moving vehicle characterized by the speed and stability predictor. The example speed and stability predictor to execute instructions to at least: compute a nearest wall distance for the moving vehicle in an environment; solve an eddy viscosity for the environment; solve a flow velocity for the environment; and determine vehicle motion to characterize a speed and stability of the moving vehicle based on the wall distance, eddy viscosity, and flow velocity.

17 Claims, 21 Drawing Sheets

Re = $10^4$

Re = $10^5$

Re = $10^4$

Re = $1.1 \times 10^4$

(51) Int. Cl.
*G05D 1/02* (2020.01)
*G06T 17/20* (2006.01)

(58) Field of Classification Search
CPC ... G06F 2119/22; G05D 1/0212; G06T 17/20; Y02T 90/00
See application file for complete search history.

(56) References Cited

OTHER PUBLICATIONS

Eugene de Villiers et al., "ELEMENTS, A New Aerodynamics Analysis Software," International Journal of Automotive Engineering vol. 6 pp. 39-44 (Year: 2015).*
C. Woolsey, "Vehicle Dynamics in Currents," Virginia Center for Autonomous Systems, Virginia Polytechnic Institute & State University, pp. 1-34 (Year: 2011).*
Castro et al., "Full scale self-propulsion computations using discretized propeller for the KRISO container ship KCS," Computers & Fluids, vol. 51, (2011), pp. 35-47.
F. R. Menter, "two-Equation Eddy-Viscosity Turbulence Models for Engineering Applications," AIAA Journal, vol. 32, No. 8, Aug. 1994, pp. 1598-1605.
Nathan Chase: "Simulations of the DARPA Suboff submarine including self-propulsion with the E1619 propeller," Jan. 1, 2012. Retrieved from the Internet: URL: http://ir.uiowa.edu/cgi/viewcontent.cgi?article=3207&context=etd. Retrieved on Mar. 12, 2018].
Soumya Chakraborty: "Ship Stability—Understanding Intact Stability of Surface Ships," Naval Architecture, Dec. 19, 2016. Retrieved from the Internet: URL:https://web.archive.org/web/20161220044253/https://www.marineinsight.com/naval-architecture/intact-stability-of-surface-ships/. Retrieved on Aug. 12, 2018].
The International Preliminary Report on Patentability issued in International application No. PCT/US2017/067649 dated Jun. 25, 2019, pp. 1-15.

* cited by examiner

SYSTEMS AND METHODS FOR COMPUTATIONAL SIMULATION OF SELF-PROPELLING VEHICLES FOR AERODYNAMIC DESIGN

CROSS-REFERENCE TO RELATED APPLICATIONS

This application is a National Stage application that claims priority to International Application No. PCT/US17/67649, filed Dec. 20, 2017, which claims the priority benefit of U.S. patent application Ser. No. 62/437,216, filed Dec. 21, 2016, the entire contents of the priority applications are incorporated by reference herein.

STATEMENT REGARDING FEDERALLY SPONSORED RESEARCH FOR DEVELOPMENT

This invention was made with government support under grant numbers DGE-1324585 and SI2-SSI 1450374 awarded by the National Science Foundation. The government has certain rights in the invention.

BACKGROUND

There are more than a billion cars in the world today. An average passenger car in the United States emits 4.7 metric tons of carbon dioxide ($CO_2$) per year. In 2014, passenger cars emitted 763 million tons of $CO_2$ in the United States. The transportation sector accounts for 26% of greenhouse gas emissions in the United States alone.

The above emission numbers result from a typical car averaging 20-30 miles per gallon (mpg). In 2012, the U.S. Environmental Protection Agency (EPA) and the Department of Transportation's National Highway Traffic Safety Administration (NHTSA) issued final rules to establish Light-Duty Vehicle Greenhouse Gas Emissions and Corporate Average Fuel Economy Standards (CAFE) for model years 2017 through 2025. The final standards are projected to result in an average industry fleetwide level of 163 grams/mile of $CO_2$ in model year 2025. Current values are 411 grams/mile of $CO_2$, which is equivalent to 54.5 mpg.

Compare above mileages to the world record for maximum mileage which is 12,665 miles per gasoline gallon equivalent (mpge) set by PAC-Car II. A "gallon equivalent of gasoline" is an amount of fuel that has the same amount of energy as the amount of energy in one gallon of gasoline. There were variety of factors that contributed to the high mileage of PAC-Car II. These factors included low drag coefficient (0.075), low mass (29 kg), and small frontal area (0.254 $m^2$). However, one of the critical factors was also a highway-style driving schedule. Calculations show that a hypothetical car with an ideal powertrain but with same aerodynamic drag and rolling friction as that of PAC-Car II, would give 75,172 mpge. Thus, there is huge potential in enabling highway driving—a promise that can be perhaps best realized by autonomous cars. Even a five-fold increase in mileage, which is much less than that of PAC-Car II, can result in five-fold reduction in emission, thus saving nearly 600 million tons of $CO_2$ from being dumped in the atmosphere per year.

Mileage loss during highway driving is significant due to aerodynamic drag. In addition, it is important to maintain steady and stable driving in the presence of fluctuating wind conditions (e.g., crosswind). Crosswinds are frequent during operation of automotive vehicles on highways. These unsteady flow conditions significantly affect the driving stability as well as aerodynamic drag on vehicles.

Figure 1:
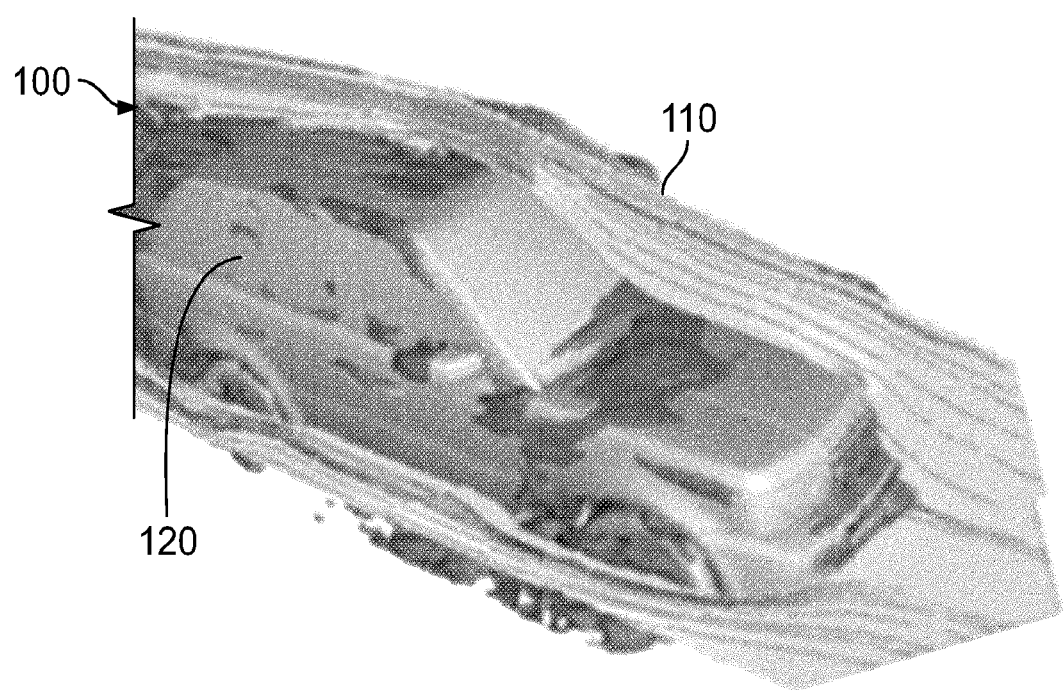
FIG. 1 illustrates a computational fluid dynamic result of air flow over and through a hood of a stationary car.

The novel features of a device of this disclosure are set forth with particularity in the appended claims. A better understanding of the features and advantages of this disclosure will be obtained by reference to the following detailed description that sets forth illustrative examples, in which the principles of a device of this disclosure are utilized, and the accompanying drawings.

DETAILED DESCRIPTION

In the following detailed description, reference is made to the accompanying drawings that form a part hereof, and in which is shown by way of illustration specific examples that may be practiced. These examples are described in sufficient detail to enable one skilled in the art to practice the subject matter, and it is to be understood that other examples may be utilized and that logical, mechanical, electrical and other changes may be made without departing from the scope of the subject matter of this disclosure. The following detailed description is, therefore, provided to describe an exemplary implementation and not to be taken as limiting on the scope of the subject matter described in this disclosure. Certain features from different aspects of the following description may be combined to form yet new aspects of the subject matter discussed below.

When introducing elements of various embodiments of the present disclosure, the articles "a," "an," and "the" are intended to mean that there are one or more of the elements. The terms "first," "second," and the like, do not denote any order, quantity, or importance, but rather are used to distinguish one element from another. The terms "comprising," "including," and "having" are intended to be inclusive and mean that there may be additional elements other than the listed elements. As the terms "connected to," "coupled to," etc. are used herein, one object (e.g., a material, element, structure, member, etc.) can be connected to or coupled to another object regardless of whether the one object is directly connected or coupled to the other object or whether there are one or more intervening objects between the one object and the other object.

As used herein, the terms "system," "unit," "module," "engine," etc., may include a hardware and/or software system that operates to perform one or more functions. For example, a module, unit, or system may include a computer processor, controller, and/or other logic-based device that performs operations based on instructions stored on a tangible and non-transitory computer readable storage medium, such as a computer memory. Alternatively, a module, unit, engine, or system may include a hard-wired device that performs operations based on hard-wired logic of the device. Various modules, units, engines, and/or systems shown in the attached figures may represent the hardware that operates based on software or hardwired instructions, the software that directs hardware to perform the operations, or a combination thereof.

In addition, it should be understood that references to "one embodiment" or "an embodiment" of the present disclosure are not intended to be interpreted as excluding the existence of additional embodiments that also incorporate the recited features.

Certain examples facilitate resolved fluid dynamics simulation of self-propelling vehicles based on engine load. Dynamics of airflow around a moving vehicle with transient components contribute significantly to overall stability and efficiency of an automobile, for example. However, current industry standard computational simulation techniques to model airflow past automobiles are constrained to flow past stationary bodies. Certain examples enable efficient simulation past objects with complex moving geometries. Additionally, certain examples enable simulation of "self-propulsion" of vehicles to, for example, predict translation and angular velocity of a car based on its engine load. Certain examples enable simulation of stability of automobiles while driving at high speeds.

Certain examples satisfy an unmet need in aerodynamic design of automobiles and in computational fluid dynamics tools. In the automotive industry, certain examples increase efficiency in a design process by enabling simulation of scenarios that can currently be done only using physical prototypes or test driving. In computational fluid dynamics (CFD) software, certain examples can become an industry standard for flow past moving and self-propelling bodies.

Certain examples enable simulation and prediction of vehicle (e.g., car, airplane, etc.) speed based on its engine load. Certain examples enable simulation and prediction of vehicle stability at high speeds. Certain examples facilitate efficient simulation of air or fluid flow past a body (e.g., automobile, freight, airplane, underwater vehicle, etc.) with moving components.

Current industry automotive design processes do not consider the dynamics of a full automobile with moving components. Current design processes do not include a prediction of vehicle velocity based on engine load until building expensive real prototypes for testing. Current simulations are typically based on constant velocity flow over fixed vehicles. Conversely, certain examples enable dynamic simulation, which revolutionizes the automotive design process.

Certain examples apply a constraint-based immersed boundary method to enable simulations to predict vehicle velocity based on its engine load. The dynamics of the airflow past a moving vehicle (e.g., automobile, airplane, etc.) differ from those of a stationary vehicle. Simulation of the velocity of a vehicle based on its engine load is satisfying an unmet need during the vehicle design process.

Certain examples extend a constraint-based immersed boundary technique to flow past commercial vehicles. In particular, certain examples model and analyze self-propelling bodies based on engine load. Consider a vehicle that is subject to a forward acceleration that is induced and balanced with a frictional force induced by spinning wheels. A speed at which this automobile travels is not known a priori—rather it is an output of an experiment. Certain examples enable numerical simulation of this process efficiently. This capability does not exist currently.

To simulate self-propelling automobiles, an entire fluid-automobiles domain is assumed to be a 'fluid'. Then, the automobile domain is constrained to move as a rigid body. When the rigid motion constraint is imposed, translational and rotational degrees of freedom are not constrained. A resulting solution provides translational and rotational velocities of the vehicle along with a detailed flow field of surrounding fluid at each time-step. This enables one-of-its kind simulation of self-propelling automobiles for given engine load—a critical capability without which studies of stability and dynamics of vehicles are not realistically possible. This same tool can be extended to aerodynamic design of airplanes since the basic idea can be easily extended. Thus, certain examples enable virtual aerodynamic design of dynamics and stability of automobiles and/or other vehicles. Virtual aerodynamic design can significantly reduce cost of physical prototypes in the design cycle. Certain examples can be adapted to CFD software libraries to facilitate improved design.

Certain examples provide an efficient computational fluid dynamics technique (e.g., referred to herein as a 'VirtualCar' technique and associated system) to simulate self-propelling automotive vehicles. A self-propelling simulation is defined herein as a simulation in which, given wheel torques, vehicle translational and turning velocities can be simulated and solved.

Certain examples provide a simulator and vehicle evaluator which satisfy an unmet need in aerodynamic design of stable vehicles. Present day aerodynamic simulations are typically based on constant velocity flow over fixed vehicles. Automotive design processes primarily rely on expensive real prototypes to test vehicle dynamics or on reduced order models. Certain examples enable dynamic fluid-vehicle simulations, which can transform the automotive design process.

Certain examples provide methods and associated systems to solve the problem of self-propelling automotive vehicles based on a constrained-Immersed Boundary (cIB) formulation. In certain examples, a scalable and efficient cIB tool to analyze self-propelling vehicles can be implemented using an Immersed Boundary Method with Adaptive Mesh Refinement (IBAMR), for example. The cIB tool provides insights into vehicle dynamics to improve aerodynamic design of stable cars, for example.

FIG. 1 illustrates a computational fluid dynamic result 100 of flow 110 over and through a hood of a stationary car 120. Certain examples enable simulation of moving cars, as well as stationary cars, in which a velocity (e.g., translational and/or rotational, etc.) of the car is solved. Such a moving vehicle simulation satisfies an unmet need in aerodynamic design of stable vehicles.

Mileage loss during highway driving is significant due to aerodynamic drag. In addition, it is important to maintain steady and stable driving in the presence of fluctuating wind conditions (e.g., crosswinds). Crosswinds are frequent during operation of automotive vehicles on highways. These unsteady flow conditions significantly affect the driving stability as well as aerodynamic drag on vehicles. Unsteady flow conditions induce unsteady three-dimensional flow features which can only be investigated based on vehicle simulations that are fully resolved in space and time. Other important unsteady flow related issues are underbody flow, flow around rolling tires, and flow through the engine compartment (e.g., underhood flow). Unsteady flow phenomena are also critical to understand the mechanisms of aerodynamic force generation and control. The eventual goals of vehicle aerodynamic design are the development of effective drag-reduction strategies and the control of driving stability. Future drag reduction strategies include "active aerodynamics" where shape changes occur depending on flow conditions.

Relying on mean flow characteristics alone is insufficient to analyze and model aerodynamics of automotive vehicles. For example, mean flow characteristics cannot resolve dynamic mechanisms such as fluctuating wind conditions. Instead, certain examples disclosed and described herein provide an accurate prediction of vehicle speed in unsteady flows. Thus, certain examples satisfy an unmet need in aerodynamic design of automobiles.

The automotive industry is one of the leading economic sectors in the world by revenue (more than trillion dollars). Certain examples transform the vehicle design process by enabling simulation of scenarios that are currently done using physical prototypes or test driving. On a broader scale, certain examples can provide an industry standard model for determining flow past any moving self-propelling body including airplanes, freights, underwater vehicles, etc.

Gaps in technology overcome to develop the systems and methods disclosed and described herein include formulation and numerical issues. For example, self-propulsion simulation of cars entails solving a coupled fluid-car problem so that the velocities of both the fluid and the car are unknowns that are solved. Efficient algorithms for this problem are required. Additionally, to achieve the goal of dynamic simulations at realistic Reynolds numbers, a numerical scheme is to handle moving bodies and resolve turbulence. Furthermore, a technique based on surface nodes/meshes instead of volume meshes translates the systems and methods into industrial practice. That is, a vehicle body is represented by a shell or surface rather than a filled volume. Prior approaches are limited to solid, filled car body models. In addition, to enable simulating an effect of flow through an engine (e.g., an underhood flow), it is helpful to have a surface nodes/mesh-based numerical problem definition. These capabilities are not currently available in moving body simulations.

Further, vehicle body computer-aided design (CAD) data is usually "dirty." For example, vehicle CAD data is a combination of different vehicle components. For current computational methods, these data need to be combined into a single surface before generating a CFD mesh. However, shapes of different components from CAD may overlap slightly, thus breaking the CFD mesh generation process. Cleaning these data is a time-consuming process, usually done with manual intervention. Certain examples provide a simulation method that does not need cleaning of the dirty CAD data, which is highly desirable. In certain examples, the simulation definition can also reflect an engine load on the vehicle.

While explicit coupling algorithms that solve fluid equations and car equations at alternate fractional time steps can be used, such algorithms can be unstable and computationally inefficient. Instead, certain examples provide efficient implicit coupling algorithms for self-propulsion.

An Immersed Boundary Method (IBM) or a Distributed Lagrange Multiplier/Fictitious Domain (DLM/FD) method can be used to process moving bodies in an accurate and computationally efficient numerical approach. Certain examples leverage these methods to provide a constrained immersed boundary (cIB) approach to model self-propulsion and flow with respect to a moving vehicle. Certain examples leverage modified cIB methodology to model translational and rotational velocity and/or other movement with respect to a vehicle under a given engine load.

Turbulence and/or other air movement can be simulated in a variety of ways. For example, flow over automotive vehicles can be characterized using Reynolds Averaged Navier-Stokes (RANS) equations. The RANS approach has relatively low computational cost in return for some modeling assumptions. Alternately, a Large Eddy Simulation (LES) approach uses subgrid scale (SGS) models in a filtered Navier-Stokes equation can be used to simulate flow around vehicles. In spite of the power of LES, it has been difficult to apply to vehicles simulations because it requires many grid points in the near-wall region at high Reynolds numbers. One way to reduce the need for refined grids near the surface is to employ wall-modeled LES (WMLES) techniques. Detached-eddy simulation (DES) is a type of WMLES method that can be used for vehicle aerodynamics. The DES functions like a RANS model in the near-wall region and like an LES model in detached regions. As such, a DES approach is promising for vehicle simulations. While certain examples model turbulence using DES, other turbulence models can be included in this formulation.

Certain examples apply DES for moving cars in the cIB approach. While IB methods can have an issue of accuracy near immersed boundaries, which can be detrimental to the resolution of turbulence near boundaries, certain examples use adaptive mesh refinement (AMR) approach to improve accuracy at or near immersed boundaries around the vehicle.

The constraint based immersed boundary (cIB) method gives accurate results for flows over immersed bodies when the body is represented as a volume rather than a shell. At a high Reynolds number (Re), there are large pressure gradients at the fluid-IB interface. This is especially pronounced when the IB is a shell with "zero-thickness." There is also a jump in pressure which leads to incorrect evaluation of pressure gradients near the fluid-IB interface. This error leads to inaccuracies in the boundary layer around the IB and can also lead to leakage of flow across the interface. Certain examples address this issue by using a novel IB formulation with a modified pressure gradient operator that calculates one-sided gradients based on a weighted essentially non-oscillatory (WENO) scheme. This removes spurious gradients in pressure across the interface. This and/or other equivalent methods can be used.

Thus, certain examples provide systems and methods to model, simulate, and evaluate vehicle motion, air flow, and design. The above techniques and associated systems can be implemented in the context of methods to process vehicle design by generating a vehicle-related model, simulating vehicle aerodynamics, processing results of simulating with the model, and adjusting a design of a vehicle and/or an associated vehicle configuration, driving/control strategy, etc., based on the processed results. In certain examples, the aerodynamic simulation can include: 1) formulation and implementation of a basic self-propulsion simulation algorithm for cars using the cIB method; 2) application of a DES approach in the cIB method to resolve turbulence; 3) generation of a surface mesh or shell in the cIB method to simulate the vehicle; and 4) simulation of vehicle design cases using the developed model and cIB method.

Figure 2:
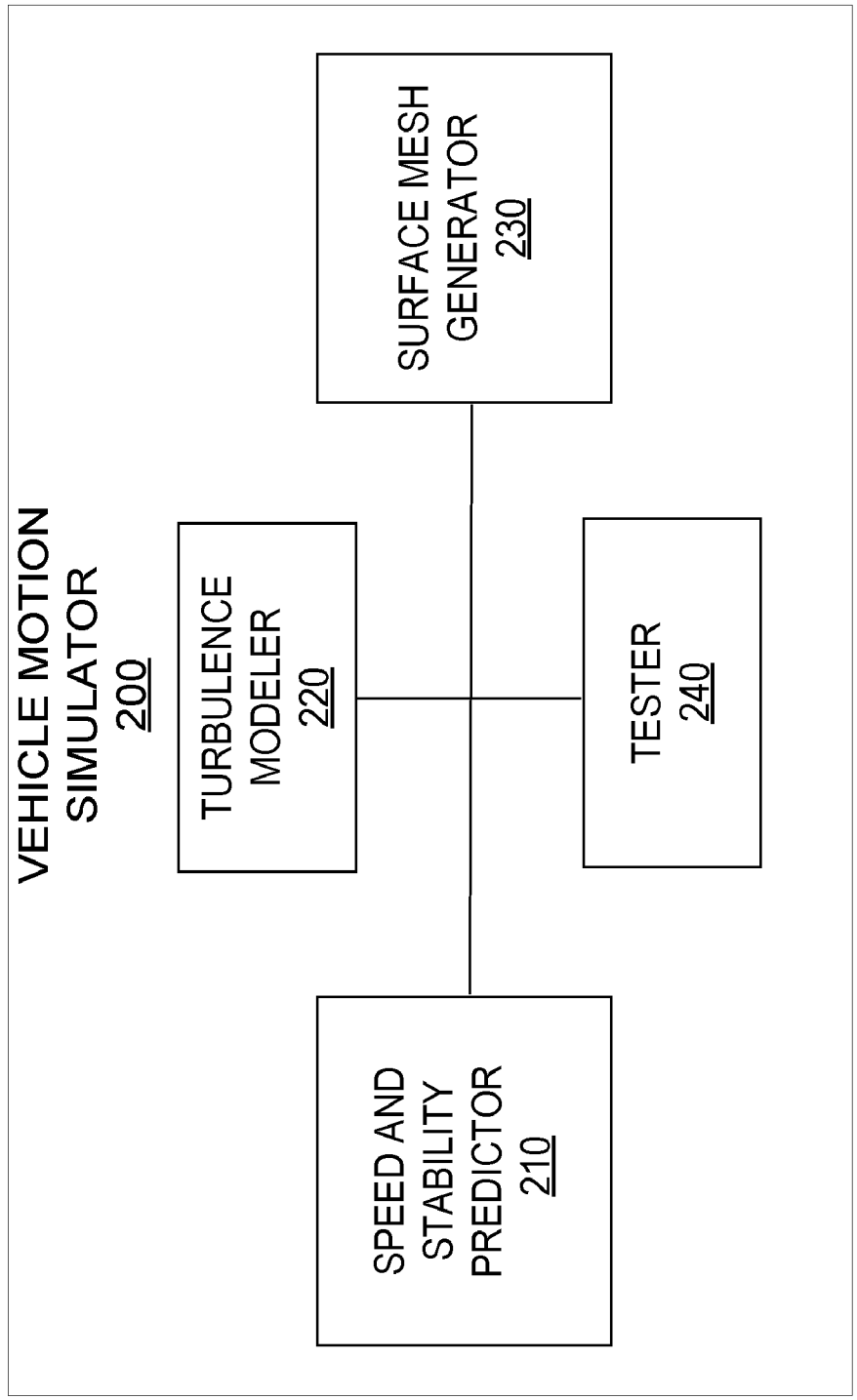
FIG. 2 illustrates a vehicle motion simulator to model and simulate a self-propelled vehicle and air flow around the vehicle in motion.

FIG. 2 illustrates a vehicle motion simulator 200 to model and simulate a self-propelled vehicle and air flow around the vehicle in motion. The example simulator system 200 includes a vehicle speed and stability predictor 210 that is to predict cruising speed and stability for a vehicle based on aerodynamics and vehicle engine load. The example simulator system 200 includes a turbulence modeler 220 that is to generate, verify, and validate a turbulence model using detached eddy simulation at high Reynolds numbers for self-propelled vehicle bodies. The example simulator system 200 includes a surface mesh generator 230 that is to generate and reformulate a surface mesh using constrained immersed boundary processing on vehicle geometries. The example simulator system 200 also includes a tester 240 to simulate vehicle design cases using the developed model and cIB method. The example tester 240 can simulate different aerodynamic shapes for lower drag, etc., and configure design test cases for translational stability, turning scenario, crosswind scenario, etc.

Figure 3A:
FIGS. 3A-3C show a plurality of configurations for the simulator system with respect to the vehicle.
Figure 3B:
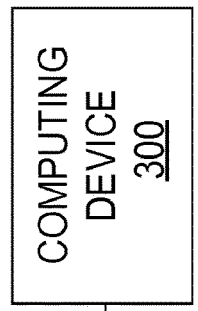
Figure 3C:
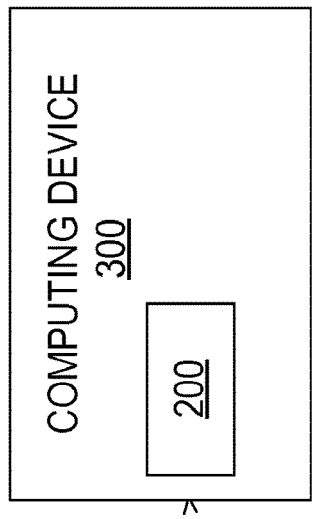

As shown in the examples of FIGS. 3A-3C, the simulator system 200 can be deployed in a variety of configurations to measure, model, and impact a vehicle. For example, FIG. 3A depicts the simulator system 200 in communication with a computing device 300 (e.g., a server, embedded processing, laptop computer, desktop computer, tablet computer, etc.) to relay modeling, simulation, and outcome information to the computing device 300 with respect to a vehicle 310. As shown in the example of FIG. 3A, the simulator system 200 is incorporated into and/or placed on the vehicle 310 to gather data, model the vehicle 310 and its environment, and simulate the vehicle 310 in motion. The example of FIG. 3B depicts the simulator 200 analyzing the vehicle 310 apart from the vehicle 310 and relaying information to the computing device 300. The example of FIG. 3C depicts the simulator 200 as part of the computing device 300 to model, simulate, and analyze a virtual model of the vehicle 310.

Returning to FIG. 2, the example speed and stability predictor 210 is a computational tool that can be used to simulate the fluid dynamics and self-propulsion of rigid vehicles. The predictor 210 generates a prediction of vehicle speed based on engine load, for example. The predictor 210 generates an algorithmic formulation of the aerodynamics around self-propelled vehicles and an implementation of a numerical method to predict cruising speed and stability from vehicle engine load, for example.

Figure 4B:
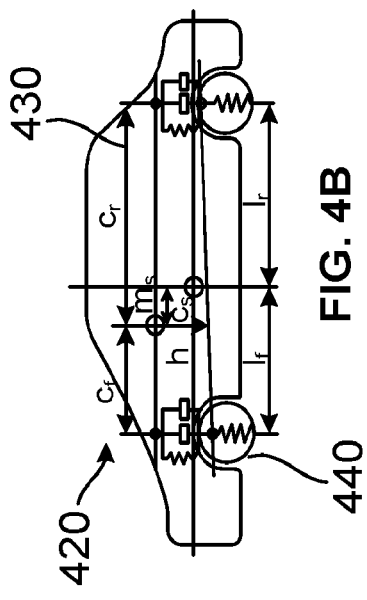
FIGS. 4A-4D illustrate example flow analysis models and methods to simulate self-propulsion of a rigid vehicle and flow around the vehicle.
Figure 4C:
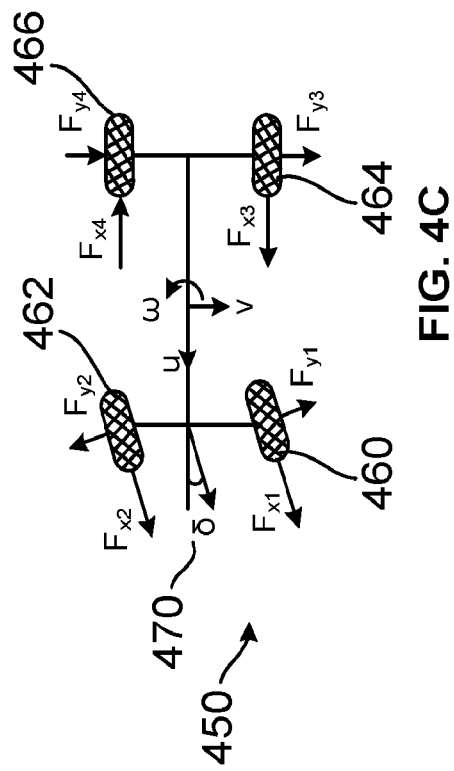
Figure 4A:
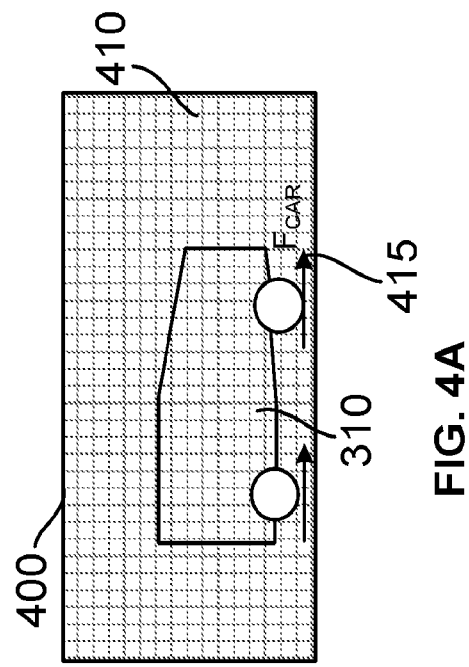

As shown in FIG. 4A, a cIB algorithm implemented by the speed and stability predictor 210 treats an environment 410 around the vehicle 310 as a fluid (e.g., a fluid domain 410) and the vehicle 310 is treated as a pseudo-fluid constrained to be rigid (e.g., a vehicle domain 310). The fluid domain 410 and vehicle domain 310 form a computation domain 400. A friction force 415 (Fcar) on wheels associated with the vehicle 310 can be determined and used to help evaluate vehicle 310 motion in a self-propulsion simulation.

FIG. 4B illustrates an example vehicle dynamics model 420 to which the cIB simulation algorithm can be coupled in the speed and stability predictor 210. The vehicle dynamics model 420 represents the vehicle 430 and its wheels 440 to quantify characteristics of the vehicle 310 in a coordinate system. For example, a vehicle mass, $m_s$, can quantify the mass of the vehicle 310 in the model 420. The model 420 can also quantify additional parameters such as front cornering stiffness, $c_f$, rear cornering stiffness, $C_r$, overall cornering stiffness (e.g., from a center of gravity for the vehicle 310), $c_s$, height of center of gravity, h, distance from center of gravity to front axle, $l_f$, distance from center of gravity to rear axle, $l_r$, etc. Thus, the model 420 can represent the vehicle 310 as a system including a body 430 and wheels 440 with a set of characteristics impacting its movement and/or other effect on its environment.

FIG. 4C depicts a second vehicle model 450 focusing on the wheels or tires 440 of the vehicle 310 and their motion. As shown in the example model 450 of FIG. 4C, wheel 460-466 are modeled separately with frictional force components in x (Fx) and y (Fy) directions acting on each wheel 460-466. A steering angle, $\delta$, 470 can also be reflected in the model as vehicle movement is modeled based on longitudinal (u) and lateral (v) velocity components of the vehicle mass center. A vorticity, $\omega$, is a pseudo-vector field that describes a local spinning motion of a continuum near a selected point (e.g., a tendency to rotate) from the perspective of an observer at the selected point traveling along with the flow of the object. The vorticity relates to circulation of a flow and can be expressed as a rotational movement.

Figure 4D:
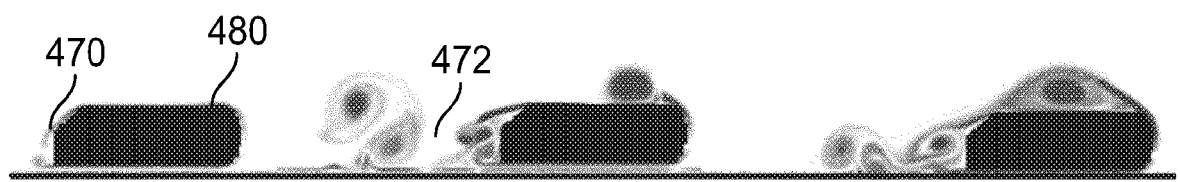

Vorticity contours 470-474 from a two-dimensional (2D) self-propulsion simulation of an Ahmed body 480 are shown in the example of FIG. 4D. The Ahmed body 480 is a simplified car model for aerodynamic analysis using computational fluid dynamics (CFD). A friction force from the ground is assumed to be known from vehicle dynamics model 420, 450. The Ahmed body 480 has accelerated to a speed of 5 miles per hour from left to right in the example of FIG. 4D.

Thus, the speed and stability predictor 210 can provide a computational method and model that can be used to simulate self-propulsion of a rigid vehicle and fluid flow around the vehicle 310. The predictor 210 provides a prediction of vehicle speed based on engine load based on: a) algorithmic formulation of the aerodynamics around the self-propelled vehicle, and b) numerical implementation of the method to predict cruising speed and stability of the vehicle. In certain examples, vehicle speed can be defined in terms of translational and rotational components.

Fluid flow can be simulated past a stationary vehicle using body-fitted meshes, for example. Simulations of rotating wheels in isolation and in a wheelhouse determine that vertical structures shed by these appendages contribute to the overall drag on an automobile. However, continual generation of unstructured, body-fitted meshes is expensive and inefficient for moving automobile bodies with complicated geometries. An alternative approach is immersed boundary (IB) methods in which the body is described in a Lagrangian reference frame and can move freely on a structured, Cartesian mesh. IB methods can simulate the flow past idealized road vehicles and a pickup truck. However, the challenging problem of simulating self-propulsion of an entire automobile with full resolution of the surrounding airflow is a different and more complicated problem that has not previously been solvable given available technology. Accurate simulation of a self-propelled vehicle provides increased efficiency in the automotive design process. Certain examples extend the cIB technique to allow for simulation and prediction of vehicle speed and stability based on a given engine load via the speed and stability predictor 210.

Low-fidelity (e.g., reduced-order, model-based) vehicle dynamics simulation models engine load, drive train, and tire movement along with differential friction from the road, among other variables. In these simulations, aerodynamic drag models are used to eventually solve for vehicle velocity. Certain examples replace aerodynamic models with a fully resolved simulation leading (the VirtualCar simulation of FIGS. 4A-4D). Assuming that a friction force propelling the vehicle 310 (equivalently, wheel torque) can be determined from vehicle dynamics models 420, 450, a vehicle simulation can be developed using the speed and stability predictor 210 In the discussion below, details of vehicle dynamics are not repeated. Instead the key concept for self-propulsion simulation that would go into the aerodynamic module is explained by assuming that the friction force propelling the car (equivallently, wheel torque) is known from vehicle dynamics models.

The cIB algorithm implemented by the speed and stability predictor 210 assumes that the entire fluid-solid domain is a fluid, and the pseudo-fluid occupying the location of the solid body is constrained to be rigid. As shown in the example of FIG. 4A, the predictor 210 can consider a simplified vehicle model 310 with wheels touching the ground and surrounded by air. First, the vehicle domain is considered to be a solid volume domain instead of a shell geometry. Extension to shell geometry is described further below. In certain examples, wheel rotational dynamics are not considered for simplicity of exposition. In other examples, wheel rotational dynamics are modeled such as in the example of FIG. 4C.

As shown in the example of FIG. 4A, suppose $\Omega$ represents the computational domain 400, which includes both the fluid 410 and vehicle 310 domains, and let $\Gamma$ be the boundary of $\Omega$ that does not coincide with the vehicle domain. Let P(t) be the vehicle domain at time t. Unknown quantities include a fluid velocity field u(x,t), where x denotes the coordinate of any point in the computational domain 400, and the translational and angular velocities of the vehicle body $U^C=(U_x^C, U_y^C, U_z^C)$ and $\omega^C$, respectively. In certain examples, $\omega^C$ is assumed to have one component to accommodate vehicle turns with a vertical velocity component of zero. The other two rotational components and the vertical velocity component can be relevant during overturning or toppling of the vehicle and can be included in the analysis. The velocity at any point within the vehicle domain is given by:

$$u_{car}=(U^C+\omega^C \times r), \quad (1)$$

where r is a coordinate with respect to an instantaneous center of mass of the vehicle 310.

With respect to a car, for example, wheel torques create a forward friction force from an effect of the ground on the wheel 460-466. Estimation of the wheel torque can be achieved based on vehicle dynamics models 420, 450, which can be coupled to the cIB algorithm, for example. Certain examples assume that the friction force on the wheels has been computed at a given instant and is collectively denoted by $F_{car}$. Rolling friction can be accounted for by appropriately reducing the forward thrust force $F_{car}$ on the vehicle. Vehicle density is different from air density. Varying density can be accommodated within cIB. For ease of presentation, the density will be assumed uniform in the presentation below. Then, a single time step/period/interval, $\Delta t$, can be defined by solving for an intermediate velocity subject to boundary conditions and project the velocity in the vehicle domain.

In a first element of the cIB algorithm, a discretized incompressible Navier-Stokes momentum and continuity equation is solved for an intermediate velocity $\hat{u}$ in the entire domain $\Omega$, subject to the boundary conditions on $\Gamma$ on a rectilinear grid:

$$\rho \left( \frac{\hat{u} - u^n}{\Delta t} + (\hat{u} \cdot \nabla)\hat{u} \right) = -\nabla p + \mu \nabla^2 \hat{u} + F_{car}, \quad (2)$$

$$\nabla \cdot \hat{u} = 0, \quad (3)$$

where $u^n$ is the solution at the end of the previous time step, p is the pressure, and $\rho$ and $\mu$ are the density and viscosity of air, respectively. An airflow outside of the solid domain is determined and set $u^{n+1}=\hat{u}$ and $p^{n+1}=p$ in $\Omega \dagger P(t)$.

In a second action of the cIB algorithm, the intermediate velocity is project (or corrected) in the vehicle domain by solving:

$$\rho \left( \frac{u^{n+1} - \hat{u}}{\Delta t} \right) = \rho \left( \frac{u_{car} - \hat{u}}{\Delta t} \right), \quad (4)$$

in P(t). In this example, the right-hand side of Eq. (3) represents a force distribution on the pseudo-fluid occupying the car domain, which ensures that $u^{n+1}=u_{car}$. However, to fully compute the right-hand side of Eq. (3), $U^C$ and $\omega^C$ are to be determined. By noting that the total linear and angular momentum must be conserved in the vehicle domain for velocity correction, momentum can be redistributed to obtain equations for $U^C$ and $\omega^C$:

$$M_{car} U_{car} = \int_{P(t)} \rho(\hat{u}) dx, \quad (5)$$

$$I_{car} \omega_{car} = \int_{P(t)} r \times \rho(\hat{u}) dx, \quad (6)$$

where $M_{car}$ is a mass of the vehicle 310 and $I_{car}$ is a moment of inertia of the vehicle 310. After the velocity of the vehicle 310 is obtained, vehicle position is updated, and the cIB algorithm repeats for the next time period. This projection and redistribution are significantly cheaper than the solution to the fluid equations from Equations (2) and (3), which dominate the overall computational cost. This is a "fully-resolved simulation" algorithm in the sense that the velocity of the vehicle 310 is determined uniquely by its body shape and weight, forward thrust, the drag induced by spinning wheels, and the aerodynamics of the flow around it. No drag models are used. Note that other standard time stepping scheme(s) can be used instead of the specific example noted above.

Figure 5A:
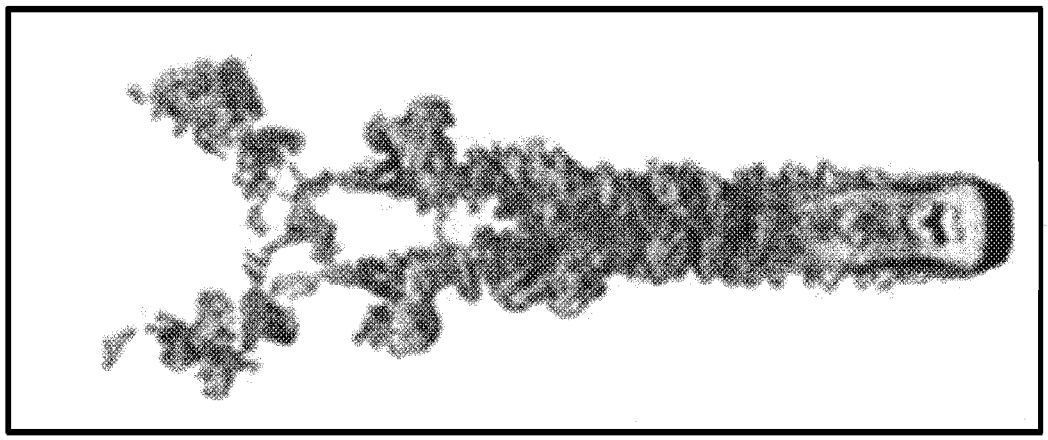
FIGS. 5A-5B show movement of a vehicle in the presence of wind.
Figure 5B:
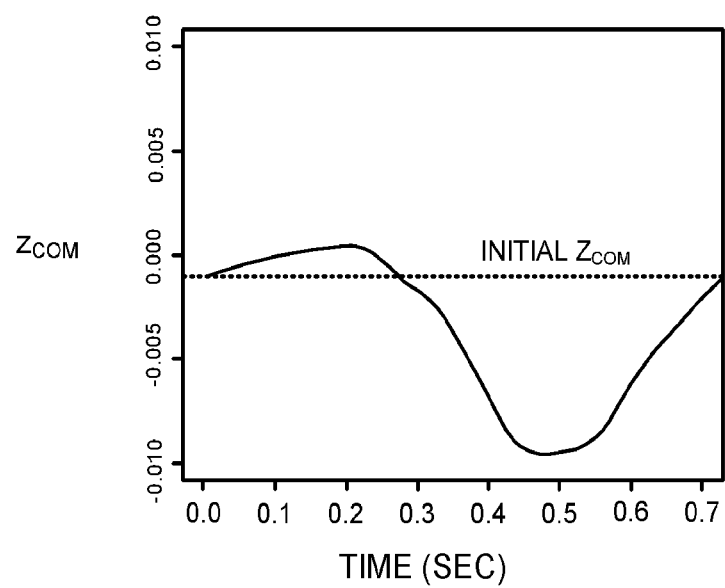

The information that can be gathered from this type of self-propelled simulation is unique and is important in automotive design process. Consider a car accelerating in the x-direction, e.g., $F_{car}=F_x i$, and assume that the gravitational force felt on the car in the y-direction is balanced by the normal force of the car's wheels making contact with the ground, e.g., $U_y^C=0$ is prescribed. The process described in Eqs. (2), (3), and (4) returns a forward driving speed of the car $U_x^C$ and a degree of "shaking" $U_z^C$ felt by the car due to unsteady aerodynamics, which can be used as a measure of driving stability even during a crosswind (see, e.g. FIGS. 5A-5B). FIG. 5A shows a view of a self-propelling 3D Ahmed body moving from left-to-right. The computed speed is 29 mph with Re=$2 \times 10^5$. FIG. 5B shows a plot of lateral movement of the vehicle (e.g., z-coordinate) indicating shaking due to unsteady wake-related forces. If F car has an additional oscillatory component in the z-direction, then the algorithm predicts a turning behavior of the vehicle.

The algorithm defined above with respect to Equations (1)-(6) is first-order in time for a divergence-free constraint. In certain examples, higher-order algorithms can be applied to self-propelling vehicles.

In certain examples, using an IBAMR infrastructure, the speed and stability predictor 210 can predict cruising speed and stability for vehicle engine load. In certain examples, massively parallel engineering simulations can be executed on adaptive meshes to model vehicles 310 and generate industry-relevant outcomes (e.g., as a design tool, etc.).

Realistic prescription of $F_{car}$ is used to generate accurate predictions of vehicle cruising speed. A thrust produced is a function of the engine horsepower $P_{eng.}$, while the effects of airflow on vehicle speed are directly resolved by solving Eqs. (2), (3), and (4). Certain examples couple the tool to vehicle dynamics models with a feedback loop. Finally, fuel consumption contributes to a transient mass loss of the vehicle ($M_{car}=M_{car}(t)$) and can be modeled accurately to predict its effect on cruising speed and efficiency.

In certain examples, the turbulence modeler 220 of the example of FIG. 2 provides a turbulent extension of the cIB algorithm. Thus, a turbulence model and can be formed and incorporated into the self-propulsion algorithm discussed above. An outcome of the turbulence modeling is a capability to simulate self-propelling bodies at high Reynolds numbers, for example. By implementing a detached eddy simulation (DES) within the IBAMR framework, self-propelling vehicles can be modeled by the turbulence modeler 220 in conjunction with the speed and stability predictor 210, for example.

To implement Detached Eddy Simulation within IBAMR, airflow past an object is characterized by Reynolds number Re=UL/v, where U and L are a characteristic velocity and length scale for the airflow, and v is a kinematic viscosity of the fluid. As Re increases, the flow becomes less viscous and increasingly turbulent: large, energetic eddies "spin up" smaller vortices in a process called the energy cascade. The smallest scales contribute significantly to the overall dissipation of momentum and energy in the fluid. Total resolution of these disparate length scales and energy cascade in computational fluid dynamics helps obtain accurate measurements of drag and prediction of flow separation and reattachment points on a solid body. However, direct numerical simulation (DNS) of an incompressible Navier-Stokes (N-S) momentum and continuity equations incurs an enormous computational cost. Realistic flows around automobile bodies typically have Reynolds numbers above $10^6$. A DNS of this type of flow requires an estimated $7 \times 10^{15}$ grid cells, a computational task realizable today by only the world's largest supercomputers.

A numerical alternative to DNS is large eddy simulation (LES). In LES, the strategy is to resolve the most energetic eddies and model the effective dissipation due to the small-scale physics. Mathematically, the fluid flow equations are filtered and an additional viscous dissipation term appears. Although LES is efficient in separated flow regimes, the computational cost scales strongly with the Reynolds number in the viscous sublayer near a solid body since the most energetic eddies have length scales on the order of the boundary layer thickness. Although there is a moderate reduction in computational cost by using LES over DNS, a full LES of flow past a ground vehicle would require upwards of $10^{11}$ grid cells and $10^7$ time steps and is estimated to be a viable industrial approach by 2045. Another alternative is the Reynolds-averaged Navier-Stokes (RANS) approach, in which all of the turbulent fluctuations are modeled and the fluid flow equations are time- or ensemble-averaged. RANS is the current industry standard for engineering flows since it can accurately predict the growth and mean flow in attached boundary layers at a much lower computational cost than LES and DNS, although it performs poorly in massively separated and strongly unsteady regimes.

Certain examples facilitate development of an industrially viable simulation technique for accurate turbulent flow predictions past moving and self-propelled bodies. Currently, the cIB algorithm is coupled with an immersed boundary method implementation within the IBAMR software, via a module called ConstraintIBMethod. Thus far, IBAMR has been used to investigate low to moderate Reynolds numbers flows. TB without AMR is suspect for turbulent flows. As a starting point, certain examples implement detached eddy simulation (DES) within IBAMR to enable turbulent flow simulations within the ConstraintIBMethod framework. DES is a hybrid turbulence model that acts like RANS in attached boundary layer regions (where a pure LES would be cost prohibitive), and acts like LES in separated flow regimes (where a pure RANS is inaccurate). DES is specifically designed with aerodynamics in mind and it is gaining popularity and viability in industrial applications. DES has not been coupled to a cIB approach for freely moving bodies.

Implementation of DES involves solving an additional Spalart-Allmaras (S-A) advection-diffusion-reaction equation for the eddy viscosity $v_T$, which is coupled to the fluid flow equations via a viscous stress term added to the right-hand side of Eq. (2). The boundary condition $v_T=0$ on the immersed body is satisfied by utilizing a projection (or correction) approach, as is done for the fluid flow equations in cIB (see Eq. (3)). Additionally, the source term in the S-A equations is computed using a minimum distance d(x) from an immersed body at every point in the computational domain. If there are N grid cells, and M points used to represent the body, a brute-force algorithm to compute d(x) has complexity $\mathcal{O}(NM)$, which is significantly costlier than the N-S or S-A solves and must be computed every time step for moving bodies. Certain examples implement parallel fast-sweeping algorithm to solve the Eikonal equation $|\nabla d(x)|^2=1$, which reduces the cost to a viable $\mathcal{O}(N)$.

Figure 6:
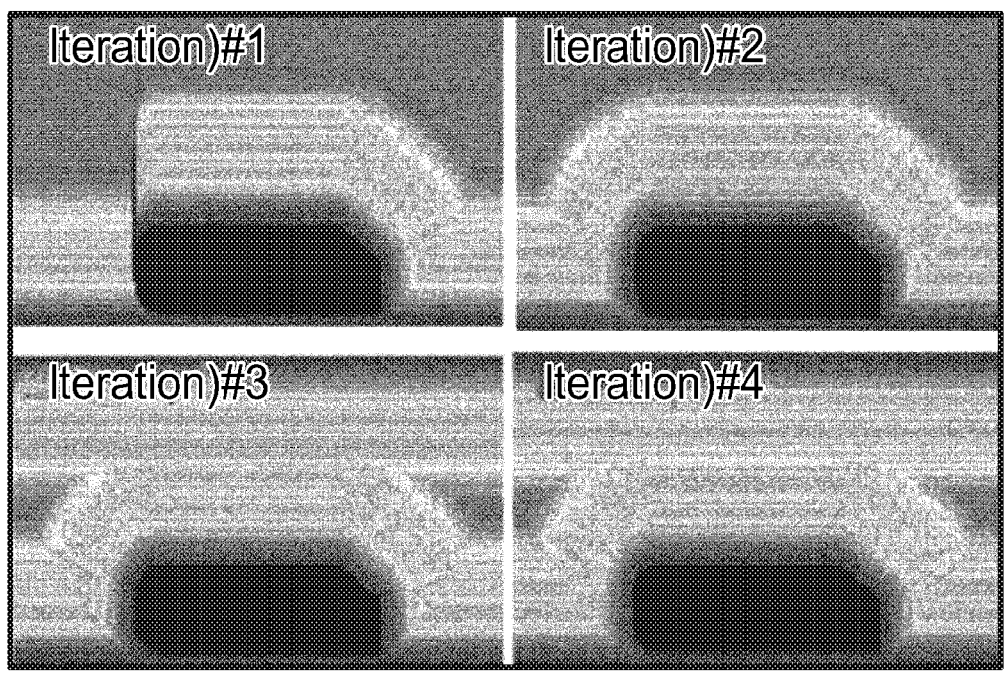
FIG. 6 illustrates example iterations to calculate a distance function for a detached eddy simulation.

Certain examples provide a technological improvement to compute d(x) on adaptive meshes resulting in efficient computation of distances from complex or non-trivial objects (see, e.g., FIG. 6). For example, as shown in FIG. 6, four iterations are executed to calculate a distance function for a DES model by solving the Eikonal equation using the $\mathcal{O}(N)$ fast sweeping method. A distance function calculation takes 10-20% of the total computation time, for example. Implementation of algorithms, numerical solvers, and projection steps utilizes IBAMR's adaptive mesh and massively parallel capabilities, allowing development of a scalable and versatile numerical technique for turbulent flows past self-propelling bodies. Additionally, incorporating a turbulence model by the turbulence modeler 220 with the speed and stability prediction from the predictor 210 represents a novel contribution to IBAMR.

Figure 7:
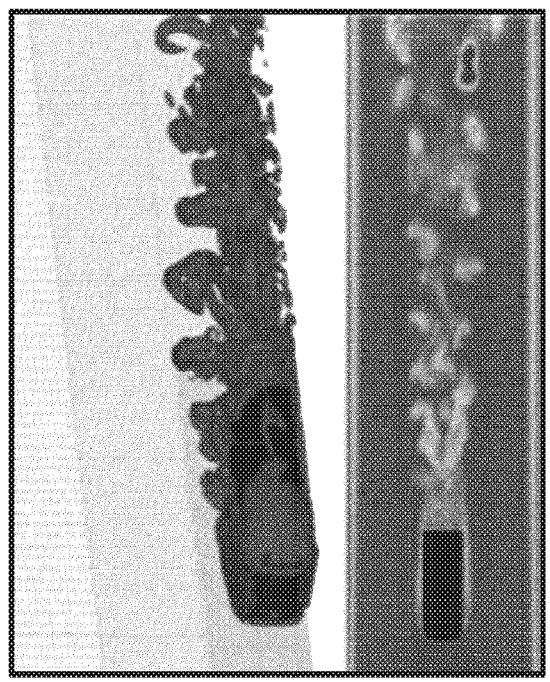
FIG. 7 illustrates example results of detached eddy simulation of flow past objects solved by a constrained-Immersed Boundary technique.
Figure 7:
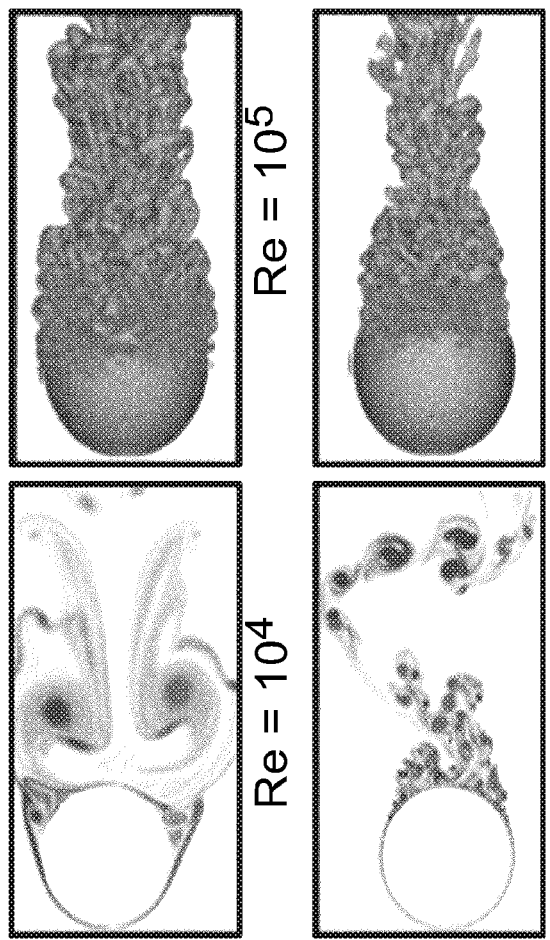

FIG. 7 illustrates example results of detached eddy simulation of flow past objects solved by the cIB technique. The adaptive mesh refinement scheme is used in all cases shown in the example of FIG. 7. A left column of FIG. 7 illustrates an example instantaneous vorticity for 2D flow past a cylinder before a drag crisis (in which drag coefficient drops off suddenly as Reynolds number increases) at Re=$10^4$ (top left) and after the drag crisis at Re=$10^6$ (bottom left). A center column of FIG. 7 depicts an example isovolume of Q-criterion for 3D flow past a sphere before the drag crisis at Re=$10^5$ (top center) and after the drag crisis at Re=$1.1\times 10^6$ (bottom center). In both cases, the separation point moves from the top of the object to the back shoulders, significantly reducing the drag. This phenomenon known as the drag crisis (in which drag coefficient drops off suddenly as Reynolds number increases) is an important test to verify a turbulence model. The right column of FIG. 7, shows an example isovolume of Q-criterion (top right) and mid-body slice of viscosity ratio $v_T/v$ (bottom right) of 3D flow past an Ahmed body at Re=$1.18\times 10^6$.

Figure 8:
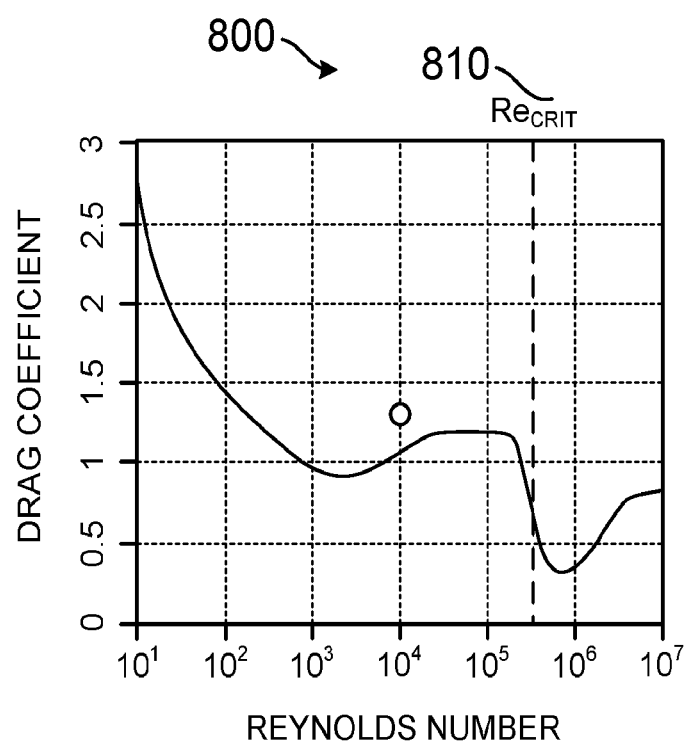
FIG. 8 illustrates an example graph of drag coefficient versus Reynolds number.

Beyond a critical Reynolds number (e.g., Re=200,000, etc.), the boundary layer of a cylinder within a uniform flow transitions from laminar to turbulent. This pushes the flow separation point from the top and bottom of the cylinder to the back shoulders, leading to a substantial reduction in drag force. This "drag crisis" can be accurately simulated by the numerical techniques disclosed herein. FIG. 8 illustrates an example graph 800 of drag coefficient versus Reynolds number, with a critical number Re$_{CRIT}$ 810 at which the drag crisis is reached.

The example surface mesh generator 230 generates a surface mesh representation of a vehicular body. Thus, the surface mesh generator 230 extends cIB formulation for a surface mesh representation of the vehicular body. The surface mesh generator 230 provides a surface mesh representation that can easily blend into industry standard practice in aerodynamic design. Certain examples provide a surface mesh reformulation and implementation of the cIB algorithm.

Using computed-aided design (CAD) software is the current industry standard for generating complex geometries. For a fluid-structure interaction problem employing a body-fitted mesh, there is an enormous cost associated with pre-processing CAD geometries. Ensuring that the geometry is "water-tight", or "not dirty"—a geometry in which an inside of the body is separated from the outside by a closed surface—can take weeks to complete for a complicated automobile geometry. An advantage of immersed boundary methods is that the IB method can handle dirty CAD geometries, effectively eliminating this pre-processing step. Surface meshes also allow set-up of geometries with internal parts, such as engine, etc., as well as the exterior contour. Underhood flow through engines is implicated and has an impact on drag on the vehicle 310.

The cIB algorithm is an example of a fictitious domain method, which assumes that the entire domain (including the region occupied by the vehicle 310) is a fluid. The force on the right-hand side of Eq. (3) is an approximation to a distributed Lagrange multiplier (DLM) field that enforces rigidity within P(t). Historically, the DLM methodology has been successful for a co-dimension 0 representation of the rigid body (e.g., there must be markers both on the surface and within the volume of the solid body, etc.). This is contrary to the standard practice in industry: complex geometries are represented as a surface mesh via a stereolithography (STL) or object geometry definition (OBJ) file format. Certain examples reformat the distributed Lagrange multiplier approach for fluid-structure interaction to enable simulation based on surface meshes for the solid body rather than volume meshes.

Enabling surface mesh capability increases the industrial viability of the cIB methodology in two ways. First, the parallel implementation of the algorithm initially requires a load-balancing in which the domain is decomposed and assigned to processors. After load-balancing, the points representing the body are read in by processor 0 and distributed among a plurality of processors based on the aforementioned domain decomposition. Load-balancing is carried out in serial and therefore, by Amdahl's law, limits the overall speedup attainable by the method. This load-balancing is computationally expensive for industrial scale problems when the number of points representing the body M is $\mathcal{O}(10^6)$ or $\mathcal{O}(10^7)$. In certain examples, a ratio of number of points needed to represent the volume of a sphere to the surface of a sphere (in a turbulent flow) is $\mathcal{O}(10^3)$, and this ratio may be significantly higher for more complicated geometries. The ratio can considerably reduce the serial computation time of the implementation.

Second, a surface mesh representation allows for more accurate predictions at the fluid-solid interface. In problems involving flow past stationary bodies at high Reynolds numbers, there is the formation of a thin boundary layer where the fluid velocity rapidly drops to zero in a thin region surrounding the surface of the body. Body-fitted meshes resolve this boundary layer well, while IB method are characterized by smearing at the fluid-solid interface. Additionally, certain IB implementations can introduce fluid leakage into the body due to inaccurate resolution of the pressure jump across the interface. An unsplit version of the cIB algorithm in which the Lagrange multipliers enforcing rigidity are exactly solved, but it is significantly more expensive than the split version described here, especially at high Reynolds numbers. Another approach is an immersed interface method (IIM). In this approach, forcing due to the immersed boundary is split off into a tangential component (which is spread onto the grid like in IB methods) and a normal component (which is used to impose the jump in pressure directly). However, IIM is used to simulate the fluid-structure interaction of thin, flexible membranes and its viability in simulating self-propelled, rigid bodies is unexplored. Yet another approach modifies the pressure gradient operator that calculates one-sided gradients on either side of the interface. In this approach, the pressure gradient operator is modified using a WENO scheme-based stencil penalization.

Once the cIB approach from the speed and stability predictor 210 has added turbulence modeling from the turbulence modeler 220 and a vehicle surface mesh from the surface mesh generator 230, the tester 240 can verify and validate the VirtualCar model and modified cIB approach to modeling and design analysis employed by the example system 200. The model and associated processing approach can then be applied to problems of platooning and stability under cross-wind, for example. An outcome of the tester 240 is a well-tested computational method and model with insights into vehicle dynamics during cross-wind conditions and platooning. Verification of the computational method by the tester 240 helps to ensure that the intended governing equations are being solved correctly. Thus, convergence tests with respect to grid and time-step sizes can be conducted.

Validation tests are important to help ensure that the computational model is a reasonably good representation of real world vehicle dynamics. To conduct validation studies, CAD data and experimental aerodynamics data for vehicles (e.g., wind-tunnel data, etc.) is used. Obtaining vehicle CAD models is not straightforward since it is proprietary information that is not shared by car companies. In addition, obtaining experimental data on aerodynamics around cars is non-trivial. Typically, such experiments are capital intensive and mostly conducted by car companies. This is evidenced by the fact that experimental research facilities on car aerodynamics are practically non-existent in academia within the United States. Additionally, data generated by car companies is not publicly available.

To address this issue of lack of easy access to car CAD and aerodynamic data, certain examples apply a two-pronged approach. First, standard test cases developed in literature can be used when CAD and aerodynamic data are available for the test cases. Second, automobile manufacturers can provide proprietary vehicle data for testing.

Figure 9A:
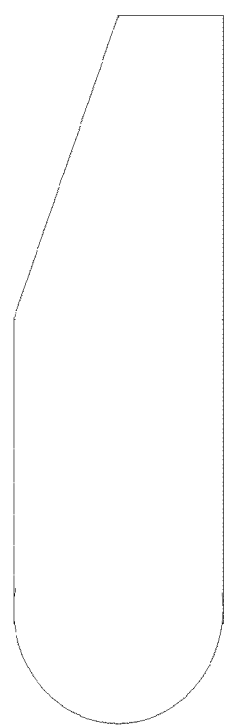
FIGS. 9A-9C illustrate example car models for testing.
Figure 9B:
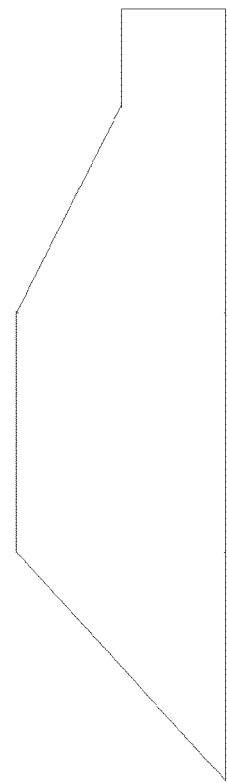
Figure 9C:
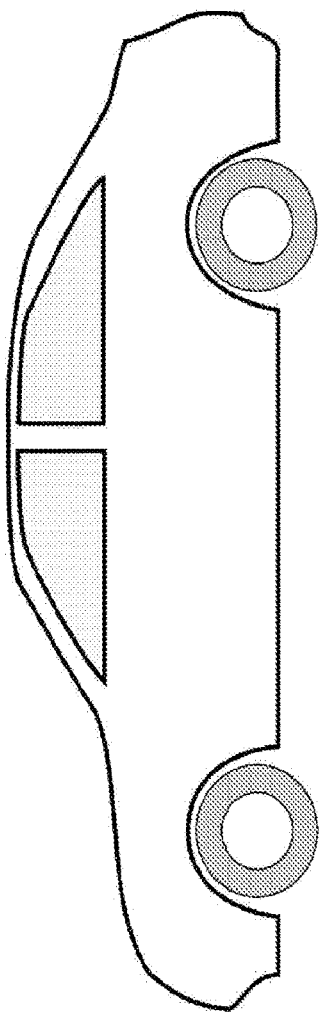

FIGS. 9A-9C illustrate example car models for testing: an Ahmed body (FIG. 9A), a Society of Automotive Engineers (SAE) notchback reference model (FIG. 9B), and a DrivAer model (e.g., developed by the Institute of Aerodynamics and Fluid Mechanics, etc.) (FIG. 9C). For the first two models, data for a car moving at constant velocity is available. For the DrivAer model, constant velocity as well as dynamic cross-wind conditions, appropriate to validate a self-propelling car simulation, are available.

The Ahmed body (represented in the example of FIG. 9A) is a simplified car model having some features common to an actual automobile (e.g., rounded front with a slanted back and generally placed just above the ground in experiments and computations, etc.). Another model called the GM model is except for a square back (rather than slanted). Experimental and numerical data for lift and drag, pressure and velocity distributions along the centerline, and root mean square velocity and pressure in different planes are available to validate a method.

The SAE notchback reference model (represented in the example of FIG. 9B) includes more realism compared to the Ahmed body. The SAE notchback reference model includes two slanted sections and two flat sections as a simple model for a small sedan. Experimental and numerical data for lift and drag, pressure and velocity distributions along the centerline, and root mean square velocity and pressure in different planes are available to validate a method.

The DrivAer model (represented in the example of FIG. 9C) is a realistic model meant to bridge a gap between a simple (e.g., Ahmed body) and a full vehicle simulation. Experimental and numerical data for lift and drag, pressure and velocity distributions along the centerline, and root mean square velocity and pressure in different planes are available to validate a method. A DrivAer model can be used to test a moving vehicle simulation solver under cross-wind conditions, which cause the vehicle to yaw. Such data can be used to validate self-propulsion simulations.

A variety of test cases, such as scenarios involving crosswinds, platooning, etc., can be applied by the tester 240 according to one or more models. For example, a wind speed of 4-5 meters per second (m/s), which is not uncommon, can produce cross-wind yaw angles of up to 100 at 65 miles per hour (mph). At the high end, 24 m/s wind speeds can result in a 400 flow yaw angle on a car. Even if rare, such events are safety concerns that can cause substantial course deviation resulting in encroachment in adjacent lanes. Stability in a cross-wind is even more important with emphasis towards lighter, more fuel-efficient vehicles, so that emissions regulations are met. An economical approach to study of cross-wind aerodynamic stability is VirtualCar, simulating the impact of gusts on a vehicle's response requires coupling between aerodynamics and vehicle handling (feedback). VirtualCar simulations can overcome a limitation on explicitly coupled vehicle motion simulations and generate a parametric study to provide a much more extensive understanding of this problem. Specifically, cross-wind speed, profile, and angle of incidence of wind can be varied. An effect of these parameters on side force coefficient, yaw moment coefficient, lateral displacement, steering wheel angle (from driver response model), yaw angle, and yaw rate can be quantified. Fundamental aerodynamics and control related insights can be obtained from these results.

Platooning has gained attention as a potential way to reduce the fuel consumption of vehicles by taking advantage of aerodynamic drag reduction caused by drafting. Platooning can be implemented using sensors that help automated control of longitudinal motion of the vehicle. This automation leads to reduction in response time, which would allow drastically reduced following distances. On larger scales, an intelligent transportation system designed for driverless cars can be enabled. The intelligent transportation system can include a smart road with an array of sensors along the road and in cars that enable feedback and automated vehicle motion control. Feedback and automated vehicle motion control can lead to a more steady driving pattern that can significantly increase mileage and drag reduction by platooning multiple vehicles. It can reduce traffic congestion since following distances between vehicles can be significantly reduced.

Numerical simulations are advantageous in this scenario to study optimal configuration (e.g., following distance) as a function of vehicle speed, road and wind conditions, among other parameters. Simulations provide flexibility and are low cost compared to traditional experimentation. Experimentation in this case can be cost-prohibitive, as directly determining the pressure field around vehicles would require an unaffordable number of sensors. In certain examples, combining numerical simulations with some experimentation as validation provides a well-balanced tradeoff yielding robust results with high confidence.

In certain examples, vehicle wheel torque (and/or speed), following distance, mass, and lane configuration (e.g., same lane versus adjacent lanes as with bird schooling), etc., can be varied. An effect of these parameters on wake dynamics, drag coefficients, and fuel consumption can be evaluated by the tester 240 to gain aerodynamic and control related insights.

Thus, certain examples allow virtual aerodynamic design of dynamics and stability of automobiles. This can significantly reduce cost of physical prototypes in the design cycle. The VirtualCar tool can be extended to aerodynamic design of airplanes, freights, and underwater vehicles since the basic idea can be easily extended, for example. Additionally, sport ball dynamics can be studied, particularly a ball response to wakes (e.g., a knuckle ball in baseball, etc.).

Certain examples provide a simulation tool that can be used to study the motion of a variety of moving objects. This approach overcomes two primary challenges: 1) fluid equations are solved on a changing domain since the immersed bodies move, and 2) coupling between the fluid and the immersed body is fully resolved without using any modeling assumptions such as drag laws. The above approach is enabling a broad repertoire of fundamental studies to understand the basic concepts in aquatic locomotion including its application to engineering and biology.

Certain examples develop computational tools that can impact areas including: a) understanding medical issues pertaining to control of movement, and b) development of novel underwater vehicles for applications ranging from reconnaissance to exploration. Certain examples provide constraint-based techniques to simulate rigid and self-propelling bodies in fluids, including self-propulsion of vehicles.

Thus, implementation of detached eddy simulation (DES) based on a Spalart-Allmaras (SA) turbulence model within a massively parallel immersed boundary software (IBAMR) with verification and validation based on computational and experimental studies enables simulations of arbitrarily moving industrial objects. Certain examples provide a robust, turbulence-modeled immersed boundary method on Cartesian meshes.

Figure 10:
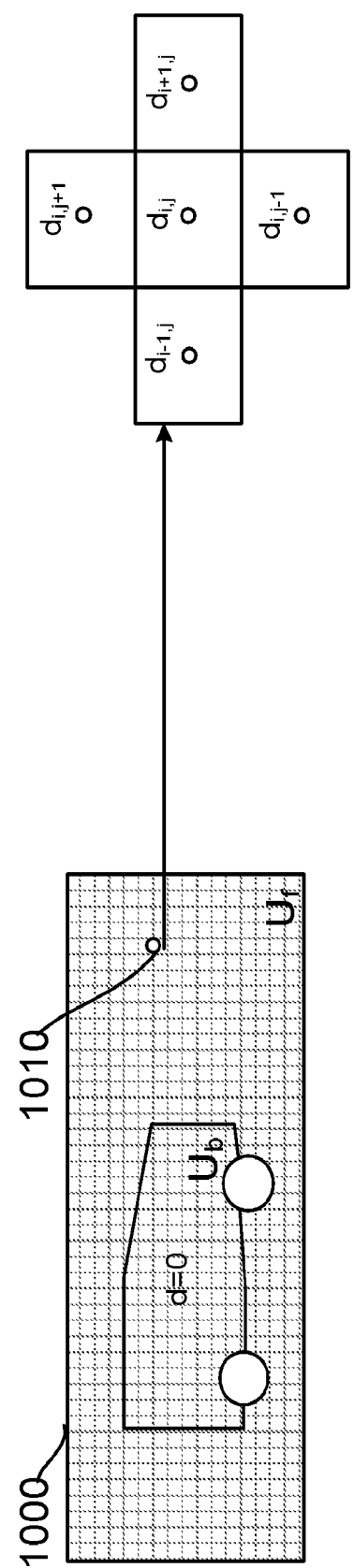
FIG. 10 depicts an example grid sweeping in alternating directions to determine nearest wall distance.

Thus, certain examples provide a distributed-memory parallel implementation of the immersed boundary (TB) method with support for Cartesian grid adaptive mesh refinement (AMR) (IBAMR) by, from time $t^n$ to time $t^{n+1}$: 1) compute a nearest wall distance $d^{n+1}$ via a fast-sweeping method; 2) solve a Spalart-Allmaras equation for $\mu_T^{n+1}$; and 3) solve Navier-Stokes equations for $\bar{u}^{n+1}$ and $p^{n+1}$ via projection. A distance computation (e.g., a wall distance by fast-sweeping, etc.) can be determined by sweeping a grid 1000 in alternating directions (see, e.g., FIG. 4A and FIG. 10) according to the Eikonal equation, $$|\nabla d(x)|^2 = 1 \xrightarrow{discretize} \frac{[(d_{i,j} - d_{min}^x)^+]^2}{\Delta x^2} + \frac{[(d_{i,j} - d_{min}^y)^+]^2}{\Delta y^2} = 1. \quad (12)$$

where $d(x)$ is an indication of time and distance such as a time taken to travel from the surface of an object $U_b$ to a point x 1010 in the grid $U_f$ 1000 at unit speed with a boundary condition $\int_{U_b} d(x)\delta(x-X(s,t))dx=0$. For a number of body nodes, M, and a number of grid points, N, fast sweeping can be accomplished according to $\mathcal{O}(2^k N)$, and brute force calculation is $\mathcal{O}(MN)$.

Figure 11:
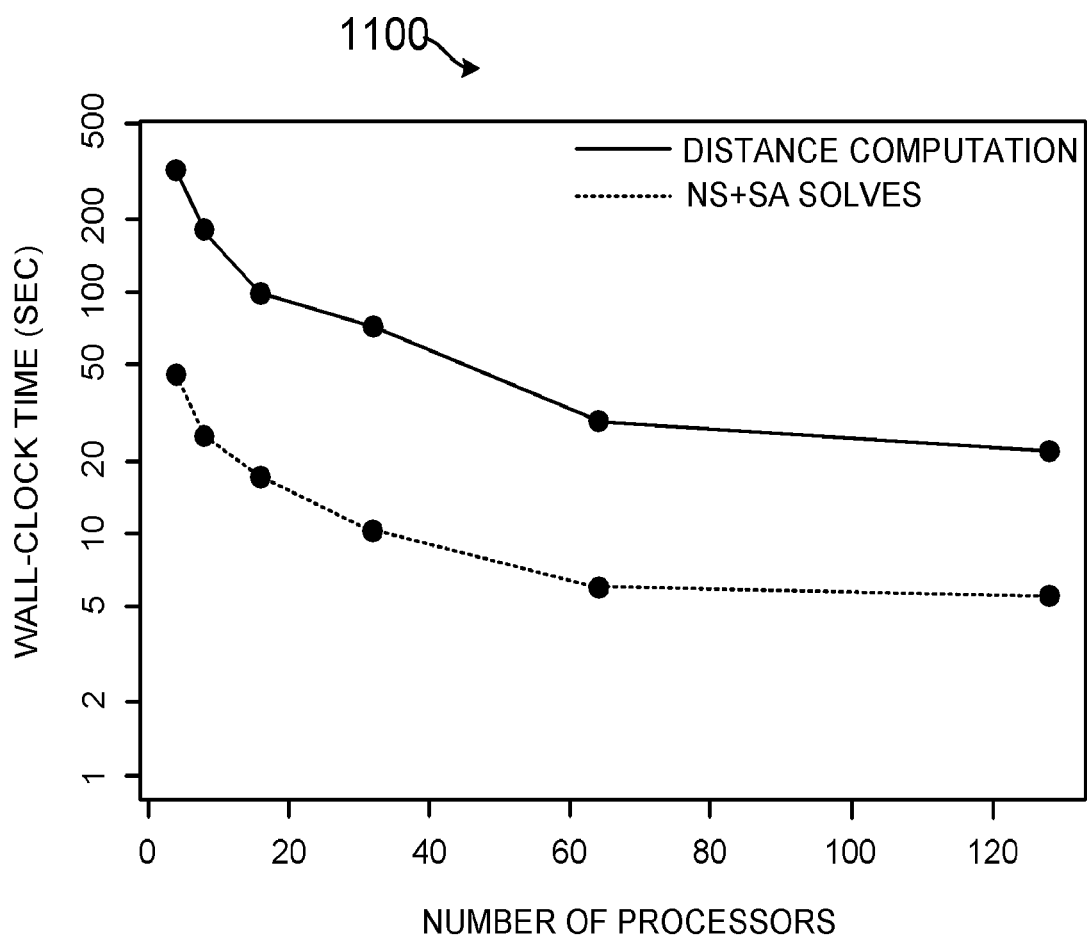
FIG. 11 illustrates an example plot of distance computational speed in which a wall-clock time is compared to a number of processors involved.

FIG. 11 illustrates an example plot 1100 of distance computational speed in which a wall-clock time (in seconds) is compared to a number of processors involved. For example, a distance solve in an entire domain is approximately 10-20% of the total computation time. For the example of FIG. 11, in which flow past a sphere is measured with $N=1.5\times10^7$ grid cells and $M=3.5\times10^6$ vertices, distance computation can be correlated and/or otherwise compared to a sequence of Navier-Stokes (NA) and Spalart-Allmaras (SA) solves.

An eddy viscosity solver solves for an intermediate eddy viscosity field, $v^{\sim *}$, without $g_c$. For example, $$\left[1 - \frac{\Delta t}{2} D\left(\frac{v + v^{\sim +}}{\sigma} D\right)\right] v^{\sim *} = (N + A)^{n-1,n}. \quad (13)$$

The field is then projected onto a constraint-satisfying eddy viscosity space by solving:

$$\frac{v^{\sim n+1} - v^{\sim *}}{\Delta t} = g_c = \frac{S[X](0_{IB} - R[X]v^{\sim *})}{\Delta t}, \quad (14)$$

where R[X] restricts from $U_f$ to IB, and S[X] spreads from IB to $U_f$.

A Navier-Stokes equation is solved in a fluid solver by solving for an intermediate velocity field $\hat{u}$ without $f_c$:

$$\begin{pmatrix} A & G \\ -D & 0 \end{pmatrix} \begin{pmatrix} u \\ p^{n+1} \end{pmatrix} = \begin{pmatrix} f \\ 0 \end{pmatrix}. \quad (15)$$

The intermediate velocity field can then be projected onto a constraint-satisfying velocity space by solving:

$$p\frac{\bar{u}^{n+1} - \hat{u}}{\Delta t} = f_c = p\frac{u_b - \hat{u}}{\Delta t}. \quad (16)$$

Momentum is conserved in $U_b$ by:

$$MU = \int_{U_b} p(\hat{u} - u_k)dx, \quad (17)$$

$$I\omega = \int_{U_b} r \times p(\hat{u} - u_k)dx. \quad (18)$$

Figure 12:
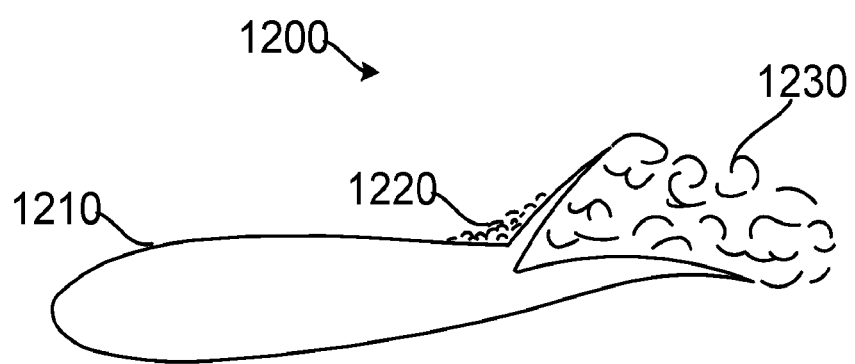
FIG. 12 illustrates an example of a combined detached eddy simulation solution.

FIG. 12 illustrates an example of a detached eddy simulation (DES) 1200 in which a RANS 1210 is too inaccurate in separated regions and a LES 1220 is too expensive in boundary layers, but a combined DES 1200 provides a 3D numerical solution using a single turbulence model, which functions as a sub-grid-scale model in regions where the grid is fine enough for the LES 1220 and as a Reynolds-averaged model in regions 1230 where the grid is not suitable for LES.

Figure 13:
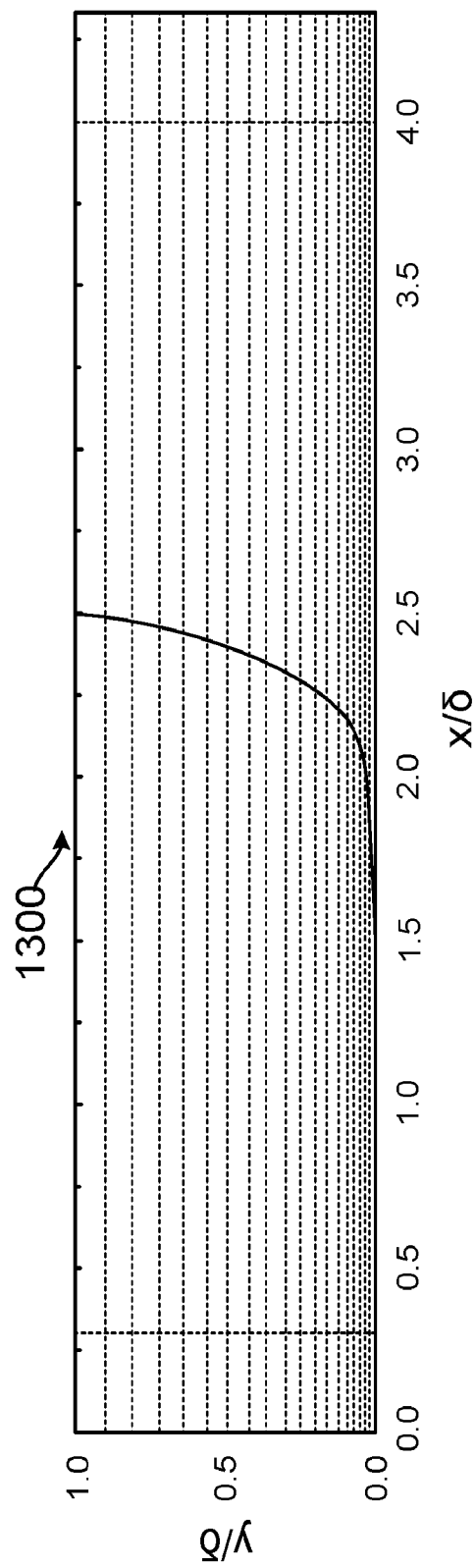
FIGS. 13-14 depict example grids for immersed boundary method analysis.
Figure 14:
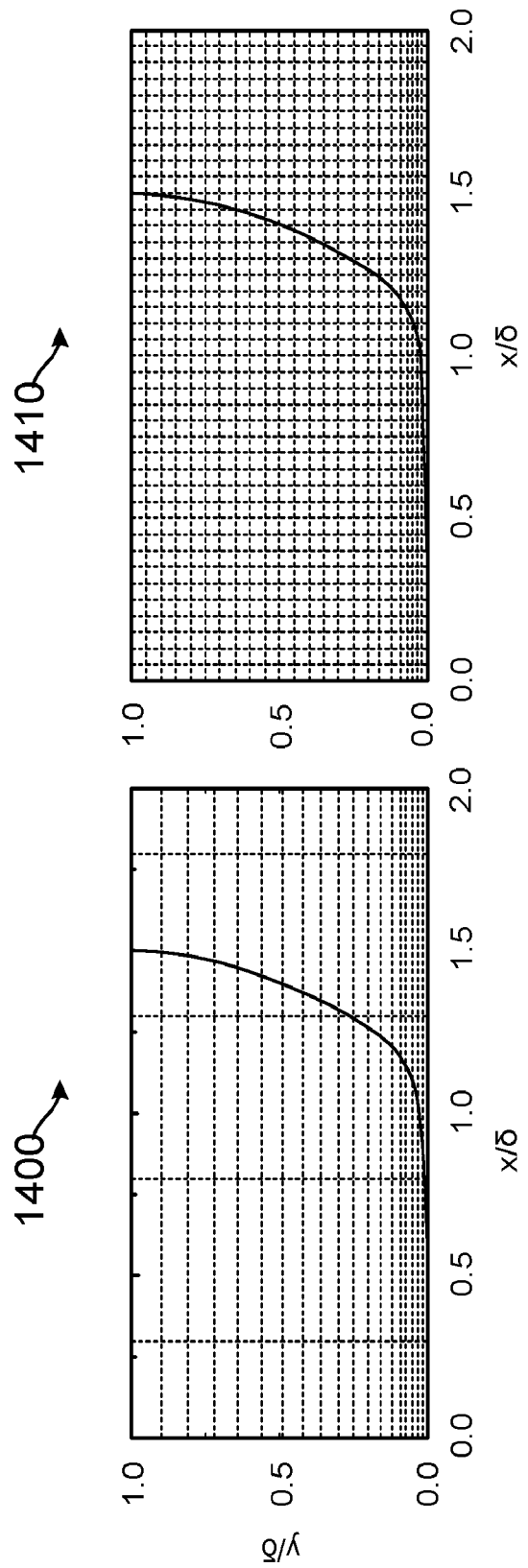

FIG. 13 illustrates an example Type I grid 1300 for delayed DES (DDES) where $\delta$ represents boundary layer thickness and A represents a maximum value among ($\Delta x$, $\Delta y$, $\Delta z$). When $\delta \geq \Delta$, the entire boundary layer is RANS modeled. FIG. 14 illustrates an example Type II grid 1400 and Type III grid 1410 for DDES. In the example Type II grid 1400, the grid 1400 is ambiguous. The lower portion is RANS modeled, and the upper portion is LES modeled, but insufficient resolution leads to modeled-stress depletion (MSD). The example Type III grid 1410 shows an entire boundary line, except wall-adjacent cells, is LES modeled with $\Delta \approx \delta/10$. Cartesian grids in Immersed Boundary methods can often be found between Type II 1400 and Type III 1410.

Figure 15:
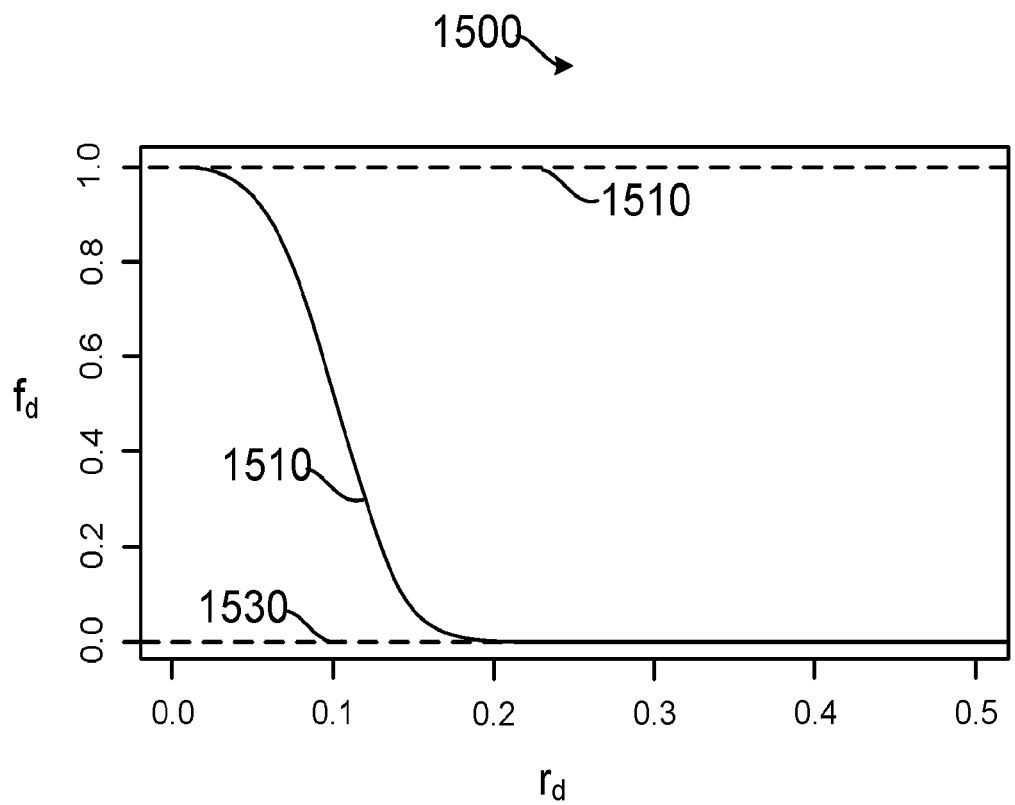
FIG. 15 illustrates a graph of an example limiter function between a detached eddy simulation region and a Reynolds Averaged Navier-Stokes region.

The example graph 1500 of FIG. 15 illustrates an example limiter function $f_d$ 1510 that fits between $f_d=1$ (DES) 1520 and $f_d=0$ (RANS) 1530 and helps regulate a smooth transition between the DES 1520 and RANS 1530 regions. The curve 1510 can be defined as:

$$f_d = 1 - \tanh([8r_d]^3), \quad (19)$$

$$r_d = \frac{v_r + v}{|\nabla \bar{u}| K^2 d^2}, \quad (20)$$

$$d = d - f_d, \max(0, d - C_{DES}\Delta). \quad (21)$$

While example implementations of the apparatus 200, 300 are illustrated in FIGS. 1-15, one or more of the elements, processes and/or devices illustrated in FIGS. 1-15 can be combined, divided, re-arranged, omitted, eliminated and/or implemented in any other way. Further, the example vehicle motion simulator 200, speed and stability predictor 210, turbulence modeler 220, surface mesh generator 230, tester 240, computing device 300, and/or vehicle model 310 of FIGS. 1-15 can be implemented by hardware, software, firmware and/or any combination of hardware, software and/or firmware. Thus, for example, any of the example vehicle motion simulator 200, speed and stability predictor 210, turbulence modeler 220, surface mesh generator 230, tester 240, computing device 300, and/or vehicle model 310 of FIGS. 1-15 can be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example vehicle motion simulator 200, speed and stability predictor 210, turbulence modeler 220, surface mesh generator 230, tester 240, computing device 300, and/or vehicle model 310 of FIGS. 1-15 is/are hereby expressly defined to include a non-transitory computer readable storage device or storage disk such as a memory, a digital versatile disk (DVD), a compact disk (CD), a Blu-ray disk, etc. including the software and/or firmware. Further still, the example vehicle motion simulator 200, speed and stability predictor 210, turbulence modeler 220, surface mesh generator 230, tester 240, computing device 300, and/or vehicle model 310 of FIGS. 1-15 can include one or more elements, processes and/or devices in addition to, or instead of, those illustrated in FIGS. 1-15, and/or may include more than one of any or all of the illustrated elements, processes and devices.

Figure 16:
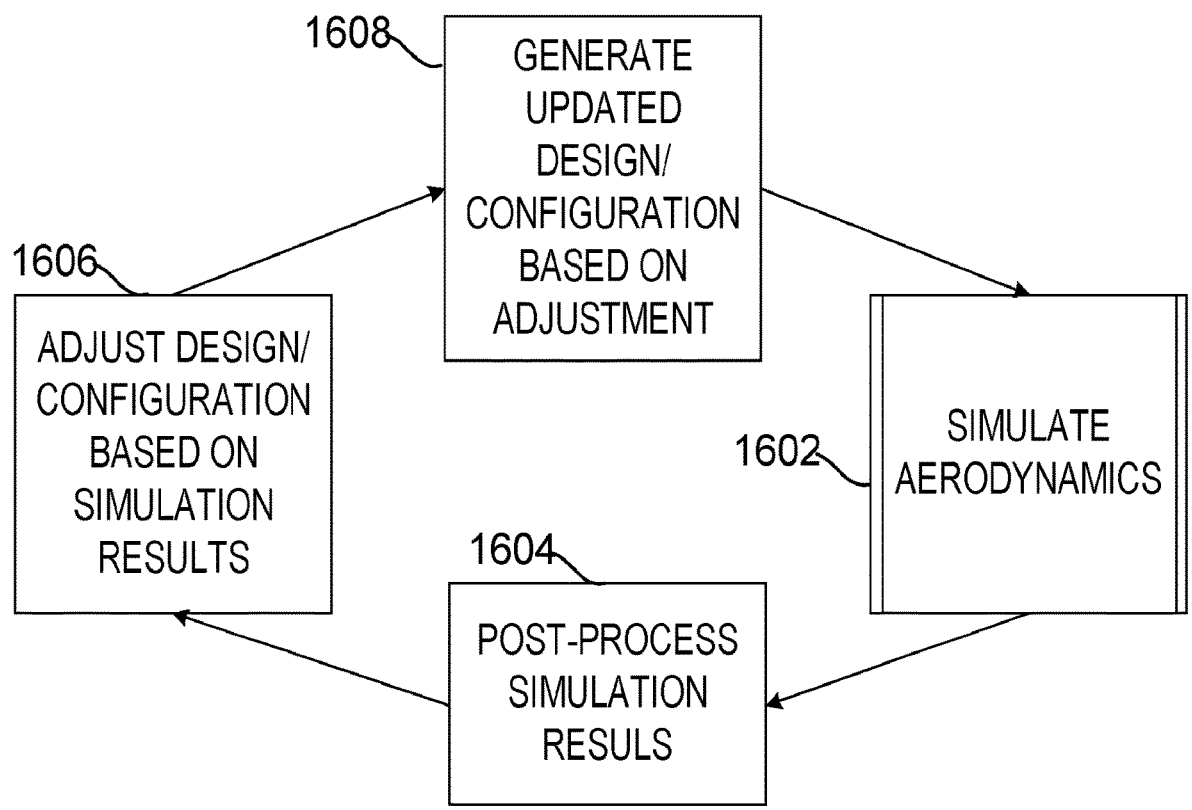
FIG. 16 shows a flow diagram of example instructions for execution by a processor to simulate vehicle motion.
Figure 18:
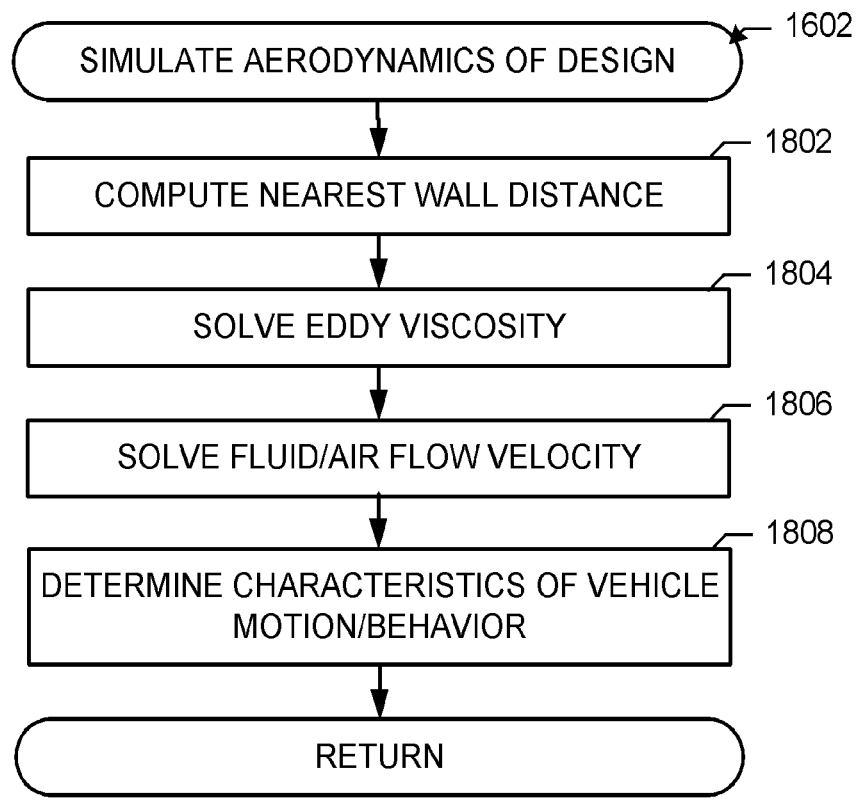
FIG. 18 shows a flow diagram of example instructions for execution by a processor to simulate vehicle motion.

A flowchart representative of example machine readable instructions for implementing, programming, and/or controlling the example simulator 200 of FIGS. 1-15 is shown in FIGS. 16 and 18. In this example, the machine readable instructions comprise a program for execution by a processor such as the processor 1918 shown in the example processor platform 1900 discussed below in connection with FIG. 19. The program may be embodied in software stored on a non-transitory computer readable storage medium such as a CD-ROM, a floppy disk, a hard drive, a digital versatile disk (DVD), a Blu-ray disk, or a memory associated with the processor 1912, but the entire program and/or parts thereof could alternatively be executed by a device other than the processor 1912 and/or embodied in firmware or dedicated hardware. Further, although the example program is described with reference to the flowcharts illustrated in FIGS. 16 and 18, many other methods of implementing, programming, and/or controlling the vehicle motion simulator 200 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, a Field Programmable Gate Array (FPGA), an Application Specific Integrated circuit (ASIC), a comparator, an operational-amplifier (op-amp), a logic circuit, etc.) structured to perform the corresponding operation without executing software or firmware.

As mentioned above, the example processes of FIGS. 16 and 18 can be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. "Including" and "comprising" (and all forms and tenses thereof) are used herein to be open ended terms. Thus, whenever a claim lists anything following any form of "include" or "comprise" (e.g., comprises, includes, comprising, including, etc.), it is to be understood that additional elements, terms, etc. may be present without falling outside the scope of the corresponding claim. As used herein, when the phrase "at least" is used as the transition term in a preamble of a claim, it is open-ended in the same manner as the term "comprising" and "including" are open ended.

FIG. 16 is an example flowchart 1600 representative of example machine readable instructions that may be executed to implement and/or operate the vehicle motion simulator 200 and associated methods. At block 1602, vehicle 310 aerodynamics are simulated as described above. For example, vehicle 310 aerodynamics can be simulated based on solving fluid equations using a cIB algorithm in an environment defined by a grid around the vehicle 310 and then correcting the solution in the vehicle domain according to one or more vehicle dynamics models. Aerodynamics simulation can include a speed and stability prediction according to the modified cIB analysis from the speed and stability predictor 210, incorporation of a turbulence model into the cIB by the turbulence modeler 220, and generation of a surface mesh for the vehicle 310 by the surface mesh generator 230. The tester 240 can verify and validate results, for example.

Figure 17:
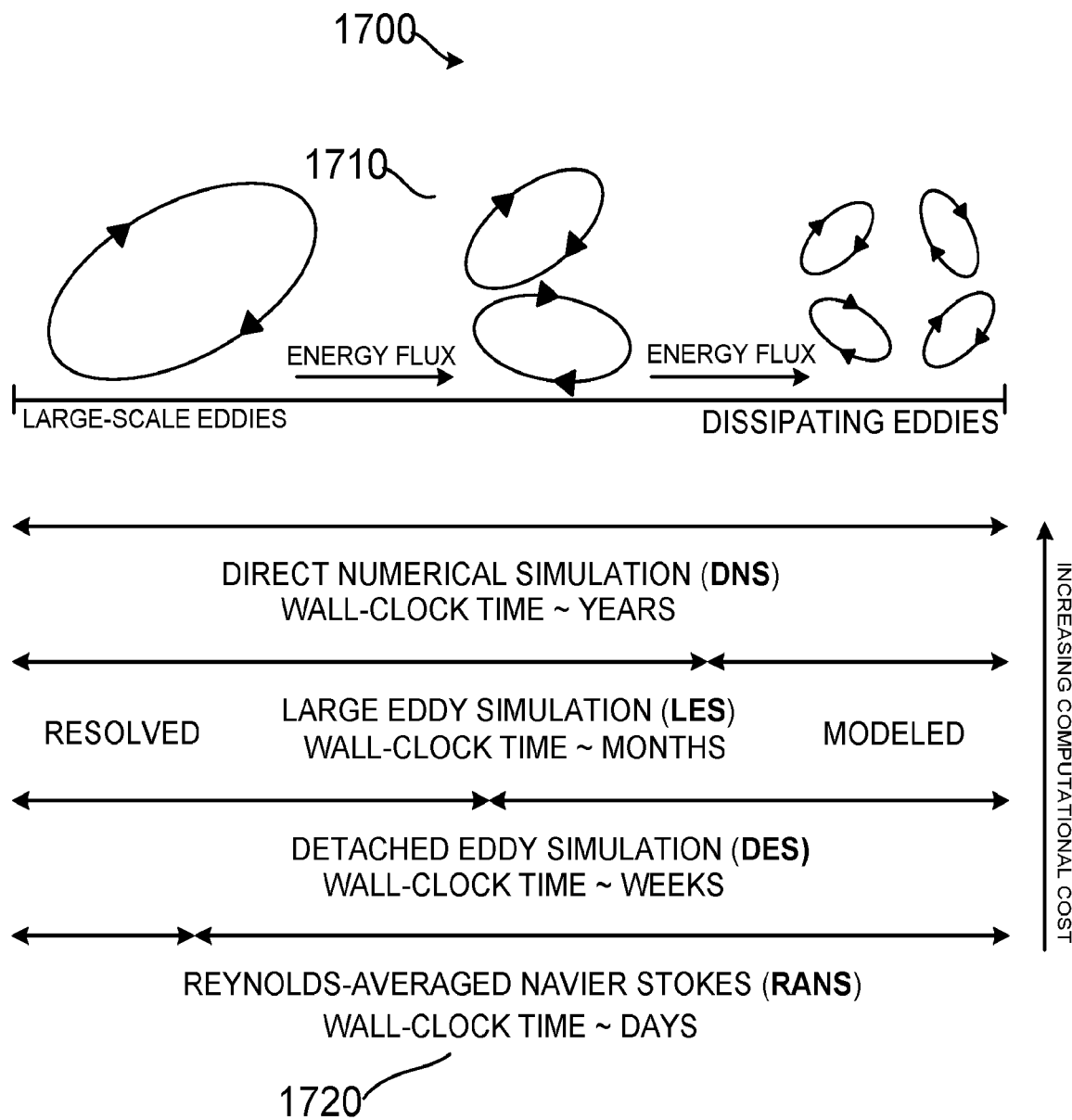
FIG. 17 depicts an example diagram showing eddy flow and simulation technique based on eddy scale and computational cost.

As shown in the example diagram 1700 of FIG. 17, fluid flow becomes turbulent at sufficiently high Reynolds numbers:

$$Re = \frac{\text{(invertial forces)}}{\text{(viscous forces)}} = \frac{\text{(length)} \times \text{(velocity)}}{\text{(viscosity)}}. \qquad (22)$$

Turbulent flows are characterized by an energy cascade, in which energy from large-scale structures is transferred to smaller scales. Resolving length scales in a turbulent flow simulation can be cost prohibitive. Turbulence modeling can approximately model energy dissipation by small scale eddies instead (see, e.g., FIGS. 7 and 17). As shown in the example of FIG. 17, at 1710, energy flux is created as large-scale eddies break up and become smaller, dissipating eddies. Modeling strategies 1720 are arranged in order of handling large-scale eddies and dissipating eddies 1710 in order of increasing computational cost. As shown in the example of FIG. 17, a direct numeral simulation (DNS) can take years of wall-clock time to execute on the turbulent flow data. A large eddy simulation (LES) can take months of wall-clock time to resolve large-scale eddies and model dissipating eddies. A detached eddy simulation (DES) can take days of wall-clock time to resolve and/or model the turbulent flow eddies. A Reynolds-Averaged Navier-Stokes (RANS) simulation can take days of wall-clock time to resolve and/or model the turbulent flow eddies. For simulating airflow around a ground vehicle 310 at Re≈1×10⁶, DES provides a beneficial option to balance accuracy and computational cost, for example.

At block 1604, results of the simulation are post-processed. For example, model information, velocity, surface boundary, flow, etc., output by the simulator 200 can be processed to provide information for adjustment to vehicle design, automated vehicle driving strategy, vehicle reaction to user driving behavior, etc.

At block 1606, vehicle design/configuration is adjusted based on the post-processed simulation results. For example, vehicle design and/or driving strategy can be adjusted to overcome an inefficiency identified through the simulation and post-processing. For example, the vehicle body design can be adjusted to overcome an efficiency given a fixed driving strategy. Conversely, an automated vehicle driving strategy can be adjusted to overcome an efficiency given a fixed vehicle body design.

At block 1608, a new vehicle body/configuration is generated based on the adjustment. For example, the adjustment to design and/or configuration is implemented to generate an updated vehicle body design, driving strategy configuration, etc. The updated vehicle body, driving configuration, etc., can be re-tested through repeat simulation, etc., at block 1602.

For example, while cruising on an open road, gusty wind conditions can cause an automobile to deviate from its desired path and even encroach on adjacent lanes. One measure of the detrimental effect due to crosswind is a lateral displacement of the vehicle's center of mass from its desired path, which can be measured in the post-processing at block 1604 following the simulation of block 1602.

In certain examples, an automobile body can be designed to limit the lateral displacement due to crosswind. First, assume that the crosswind speed/frequency and the driving strategy are fixed for each simulation carried out in the design process. Also assume the example process 1600 begins with a base vehicle body configuration to be improved. It is known that the rear slant angle can have a significant effect on the lateral displacement of a vehicle 310 in crosswind conditions. Moreover, there could be some additional constraints on the vehicle 310, such as a minimum driving speed requirement or a maximum weight limit that need to be satisfied. To minimize or otherwise reduce the lateral displacement subject to some constraints, the design flow would begin at block 1608 to generate an automobile body based on the current, base design. At block 1602, aerodynamics of the design are simulated. At block 1604, post-processing of results includes: 1) computing a lateral displacement due to crosswind and 2) computing a cruising velocity of the vehicle. At block 1606, vehicle design is adjusted by decreasing or increasing a rear slant angle. The rear slant angle can be adjusted based on one or more of the following questions answered by the post-processed results: 1) did the vehicle reach its desired speed?; 2) did the lateral displacement due to crosswind decrease?; 3) is the vehicle heavier than a desired weight limit?; etc. At block 1608, based on the determined adjustment (e.g., increase or decrease) of rear slant angle, a new vehicle body can be generated.

In certain examples, a more comprehensive study that considers an effect of additional appendages (e.g., front and rear spoilers, etc.), design aspects (e.g., front or side surface area, etc.), and/or constraints (e.g., front or side drag coefficients, etc.) on other output parameters such as yaw angle, yaw rate, etc., can be designed based on the above framework. Hence, the example is provided for the purposes of illustration only.

In certain examples, drag reduction on multiple vehicles in certain platooning configurations can lead to decreased fuel usage and, therefore, increased fuel efficiency. A design study using the presently disclosed simulation 1600 can be used to determine an optimal or otherwise improved platooning arrangement. First, a number of automobiles and their body design is assumed to be fixed for each simulation carried out in the design process. Additionally, a base platooning configuration to be improved is assumed. A goal includes to maximize the fuel efficiency given a major constraint that the vehicles cannot be allowed to collide with one another. The example design flow would begin at block 1608 to generate a platooning configuration based on available information for the base platooning configuration. At block 1602, aerodynamics of the base platooning configuration are simulated. At block 1604, post-processing of results includes computing fuel efficiency based on distance traveled, time period, drag coefficients, etc. At block 1606, the platooning configuration is adjusted based at least in part on the following questions answered by the post-processed simulation results: 1) did the automobiles collide?; 2) did the fuel efficiency decrease?; etc. At block 1608, a new or updated platooning configuration is generated based on newest available information from the configuration adjustment.

In certain examples, automobile body design is also considered, and each vehicle's wheel torque can be designed based on the above framework. Hence, the example is provided for the purposes of illustration only.

FIG. 18 provides further example detail regarding block 1602 to simulate aerodynamics of vehicle design/configuration. At block 1802, a nearest wall distance is computed for the vehicle 310. For example, by fast sweeping in alternating directions through the grid 400 formed from the vehicle 310 environment over one or more iterations, the nearest wall distance can be computed (e.g., via Eikonal's equation, etc.). The vehicle 310 can be characterized at least in part by its engine load, for example, and the environment 400 characterized at least in part by motion of the vehicle 310 in the environment 400.

At block 1804, eddy viscosity is solved for the vehicle 310 in its environment 400. For example, Spalart-Allmaras equations can be solved to determine an intermediate eddy viscosity field and project the viscosity field onto constraint-satisfying eddy viscosity space.

At block 1806, fluid/air flow velocity is solved for the vehicle 310 in its environment 400. For example, Navier-Stokes equations can be solved to determine an intermediate velocity field and project the velocity field onto constraint-satisfying velocity space. The velocity can be quantified as a translational velocity and/or a rotational velocity with respect to the vehicle 310, for example.

At block 1808, characteristics of vehicle motion and/or other behavior are determined. For example, based on nearest wall distance, viscosity field, velocity field, etc., vehicle speed and stability in a given airflow can be determined, as modified by a turbulence model and improved by a surface mesh, etc. Vehicle behavior in a crosswind, platoon configuration, etc., can be modeled based on the outcome of the simulation process 1602 (e.g., at block 1604). An effect of an adjustment (block 1606) on vehicle design and/or configuration (block 1608) can be validated and verified by the simulation (block 1602) to determine whether the change had a positive or negative effect on vehicle aerodynamics in the simulation, for example.

Thus, certain examples provide improved systems and methods to model vehicle behavior in an environment and provide suggested design and/or configuration modifications to adjust the vehicle to improve performance in such an environment (e.g., crosswinds, platooning, etc.). Certain examples quantify translational and/or rotational aspects of velocity (e.g., caused by crosswinds and/or other eddy-generating air flows, etc.) and characterize the vehicle model based on engine load. Certain examples can model the vehicle, be incorporated into the vehicle, be separate from the vehicle, etc., and react to gathered data, models, assumptions, and configured simulation parameters. Certain examples provide a robust, massively parallel immersed boundary method with turbulence modeling to enable accurate simulation of external airflow on moving vehicles. The cIB methodology provides improved efficiency (e.g., from reduced aerodynamic draft following design change, etc.) and safety (e.g., from improved design and/or vehicle behavior in fluctuating crosswind and/or other wind condition that can affect driving stability, etc.), for example.

Figure 19:
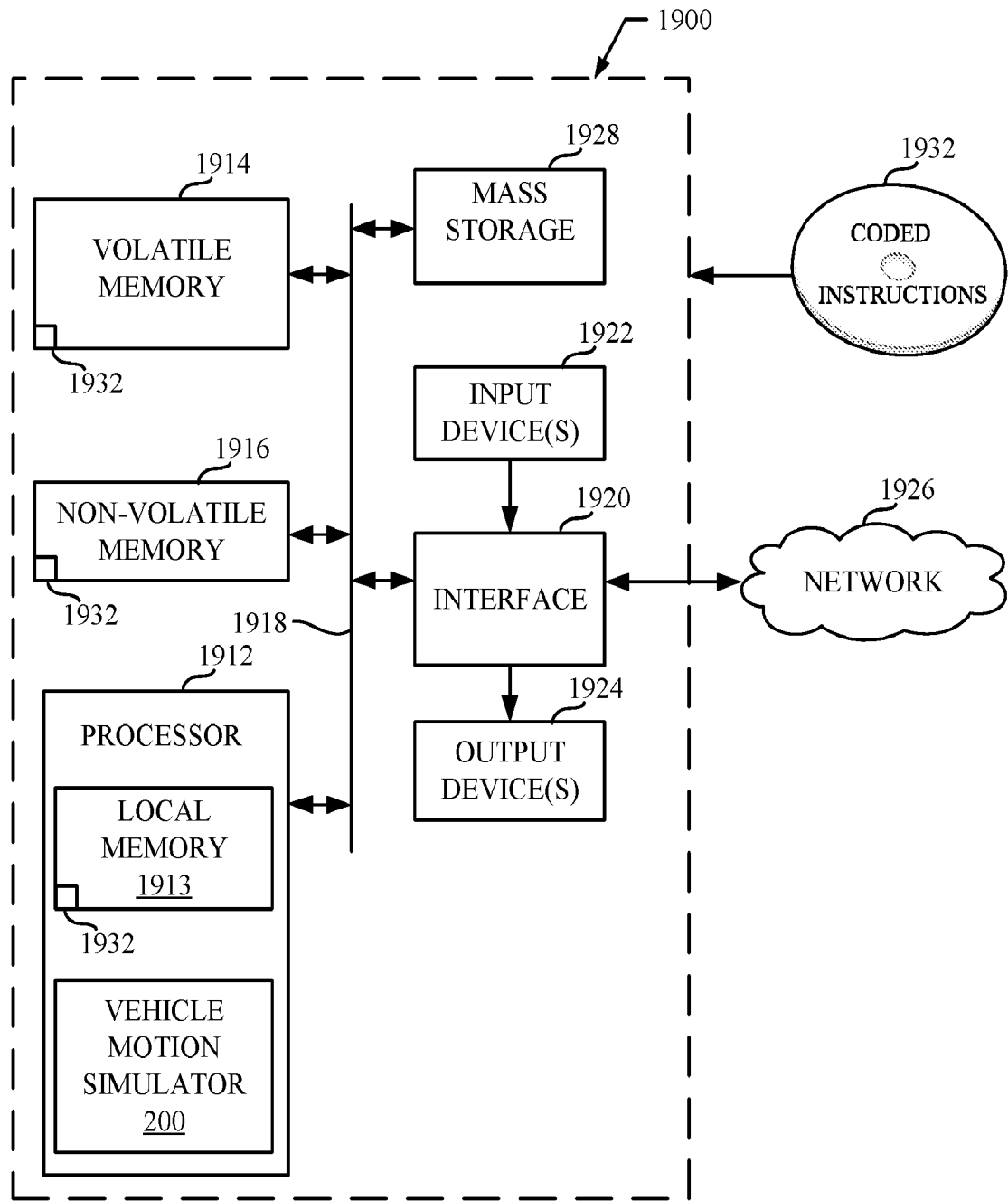
FIG. 19 is a block diagram of an example processor platform capable of executing instructions to implement the example apparatus, systems and methods disclosed and described herein The figures are not to scale. Wherever possible, the same reference numbers will be used throughout the drawing(s) and accompanying written description to refer to the same or like parts.

FIG. 19 is a block diagram of an example processor platform 1900 capable of executing instructions to implement the example apparatus, systems and methods disclosed and described herein (e.g., the example vehicle motion simulator 200, etc.). The processor platform 1900 can be, for example, a server, a personal computer, a mobile device (e.g., a cell phone, a smart phone, a tablet such as an IPAD™) a personal digital assistant (PDA), an Internet appliance, or any other type of computing device.

The processor platform 1900 of the illustrated example includes a processor 1912. Processor 1912 of the illustrated example is hardware. For example, processor 1912 can be implemented by one or more integrated circuits, logic circuits, microprocessors or controllers from any desired family or manufacturer.

Processor 1912 of the illustrated example includes a local memory 1913 (e.g., a cache). Processor 1912 of the illustrated example is in communication with a main memory including a volatile memory 1914 and a non-volatile memory 1916 via a bus 1918. Volatile memory 1914 can be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1916 can be implemented by flash memory and/or any other desired type of memory device. Access to main memory 1914, 1916 is controlled by a memory controller. The processor 1912, alone or in conjunction with the memory 1913, can be used to implement all or part of the apparatus, systems, and/or methods disclosed herein.

Processor platform 1900 of the illustrated example also includes an interface circuit 1920. Interface circuit 1920 can be implemented by any type of interface standard, such as an Ethernet interface, a universal serial bus (USB), and/or a PCI express interface.

In the illustrated example, one or more input devices 1922 are connected to the interface circuit 1920. Input device(s) 1922 permit(s) a user to enter data and commands into processor 1912. The input device(s) 1922 can be implemented by, for example, an audio sensor, a microphone, a camera (still or video), a keyboard, a button, a mouse, a touchscreen, a track-pad, a trackball, isopoint and/or a voice recognition system.

One or more output devices 1924 are also connected to interface circuit 1920 of the illustrated example. Output devices 1924 can be implemented, for example, by display devices (e.g., a light emitting diode (LED), an organic light emitting diode (OLED), a liquid crystal display, a cathode ray tube display (CRT), a touchscreen, a tactile output device, a light emitting diode (LED), a printer and/or speakers). Interface circuit 1920 of the illustrated example, thus, typically includes a graphics driver card, a graphics driver chip or a graphics driver processor.

Interface circuit 1920 of the illustrated example also includes a communication device such as a transmitter, a receiver, a transceiver, a modem and/or network interface card to facilitate exchange of data with external machines (e.g., computing devices of any kind) via a network 1926 (e.g., an Ethernet connection, a digital subscriber line (DSL), a telephone line, coaxial cable, a cellular telephone system, etc.).

Processor platform 1900 of the illustrated example also includes one or more mass storage devices 1928 for storing software and/or data. Examples of such mass storage devices 1928 include floppy disk drives, hard drive disks, compact disk drives, Blu-ray disk drives, RAID systems, and digital versatile disk (DVD) drives.

Coded instructions 1932 associated with any of the examples disclosed and described herein can be stored in mass storage device 1928, in volatile memory 1914, in the non-volatile memory 1916, and/or on a removable tangible computer readable storage medium such as a CD or DVD.

It may be noted that operations performed by the processor platform 1900 (e.g., operations corresponding to process flows or methods discussed herein, or aspects thereof) may be sufficiently complex that the operations may not be performed by a human being within a reasonable time period.

EXAMPLES

Example 1 is a vehicle motion simulator system including a speed and stability predictor to simulate and predict a translational and rotational velocity of a moving vehicle based on a determination of engine load for the moving vehicle characterized by the speed and stability predictor. The example speed and stability predictor to execute instructions to at least: compute a nearest wall distance for the moving vehicle in an environment; solve an eddy viscosity for the environment; solve a flow velocity for the environment; and determine vehicle motion to characterize a speed and stability of the moving vehicle based on the wall distance, eddy viscosity, and flow velocity.

Example 2 includes the subject matter of example 1, wherein eddy viscosity and flow velocity are to simulate stability of the moving vehicle while the vehicle is moving at high speed or in windy conditions.

Example 3 includes the subject matter of example 1, wherein the system is to simulate moving of at least one of air or fluid past the moving vehicle.

Example 4 includes the subject matter of example 1, wherein the vehicle includes at least one of an automobile, an airplane, or an underwater vehicle.

Example 5 includes the subject matter of example 1, wherein the simulation includes a constraint-based immersed boundary method to predict a velocity of the moving vehicle based on a determination of engine load for vehicle.

Example 6 includes the subject matter of example 5, wherein the constraint-based immersed boundary method is used to formulate a detached eddy simulation.

Example 7 includes the subject matter of example 1, wherein the speed and stability predictor is to leverage a vehicle dynamics model to determine flow velocity.

Example 8 includes the subject matter of example 1, wherein the system is to output an adjustment for at least one of vehicle design or vehicle configuration based on the vehicle motion.

Example 9 includes the subject matter of example 1, further including a turbulence modeler to generate a turbulence model using detached eddy simulation at high Reynolds numbers for the moving vehicle.

Example 10 includes the subject matter of example 1, further including a surface mesh generator to generate and reformulate a surface mesh using constrained immersed boundary processing on a moving vehicle geometry.

Example 11 is a computer-implemented method to simulate and predict a velocity of a moving vehicle based on a determination of engine load for the vehicle. The example method includes: computing, using a processor, a nearest wall distance for the moving vehicle in an environment; solving, using the processor, an eddy viscosity for the environment; solving, using the processor, a flow velocity for the environment; and determining, using the processor, vehicle motion to characterize a speed and stability of the moving vehicle based on the wall distance, eddy viscosity, and flow velocity.

Example 12 includes the subject matter of example 11, wherein eddy viscosity and flow velocity are to simulate stability of the moving vehicle while the vehicle is moving at high speed or in windy conditions.

Example 13 includes the subject matter of example 11, wherein solving the eddy viscosity and solving the flow velocity utilize a constraint-based immersed boundary method to predict a velocity of the moving vehicle based on a determination of engine load for vehicle.

Example 14 includes the subject matter of example 15, wherein the constraint-based immersed boundary method is used to formulate a detached eddy simulation.

Example 15 includes the subject matter of example 11, wherein solving the flow velocity further includes leveraging a vehicle dynamics model to determine the flow velocity.

Example 16 includes the subject matter of example claim 11, further including outputting an adjustment for at least one of vehicle design or vehicle configuration based on the vehicle motion.

Example 17 includes the subject matter of example 11, further including generating a turbulence model using detached eddy simulation at high Reynolds numbers for the moving vehicle.

Example 18 includes the subject matter of example 11, further including generating a surface mesh using constrained immersed boundary processing on a moving vehicle geometry.

Example 19 is computer readable storage medium including instructions which, when executed by a processor, implement a method to simulate and predict a velocity of a moving vehicle based on a determination of engine load for the vehicle. The example method includes computing a nearest wall distance for the moving vehicle in an environment; solving an eddy viscosity for the environment; solving a flow velocity for the environment; and determining vehicle motion to characterize a speed and stability of the moving vehicle based on the wall distance, eddy viscosity, and flow velocity.

Example 20 includes the subject matter of example 19, wherein solving the eddy viscosity and solving the flow velocity utilize a constraint-based immersed boundary method to predict a velocity of the moving vehicle based on a determination of engine load for vehicle.

Example 21 includes the subject matter of example 20, wherein the constraint-based immersed boundary method is used to formulate a detached eddy simulation.

Example 22 includes the subject matter of example 19, wherein solving the flow velocity further includes leveraging a vehicle dynamics model to determine the flow velocity.

Example 23 includes the subject matter of example 19, wherein the method further includes outputting an adjustment for at least one of vehicle design or vehicle configuration based on the vehicle motion.

Example 24 includes the subject matter of example 19, wherein the method further includes generating a turbulence model using detached eddy simulation at high Reynolds numbers for the moving vehicle.

Example 25 includes the subject matter of example 19, wherein the method further includes generating a surface mesh using constrained immersed boundary processing on a moving vehicle geometry.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A vehicle motion simulatorsystem comprising:
   a processor configured to predict a translational and rotational velocity of a moving vehicle based on a determination of engine load for the moving vehicle, wherein the processor is further configured to:
   compute a nearest wall distance for the moving vehicle in an environment;
   solve an eddy viscosity for the environment using a constraint based immersed boundary method to determine a detached eddy simulation of the moving vehicle, wherein the environment is a fluid, and a pseudo-fluid occupying a location of the moving vehicle is constrained to be rigid;
   solve a flow velocity for the environment;
   determine the translational and rotational velocity of the moving vehicle based on the engine load and on the nearest wall distance, the eddy viscosity, and the flow velocity; and
   adjust a rear slant angle of update a vehicle design of the moving vehicle based at least in part on the determined translational and rotational velocity of the moving vehicle to reduce lateral displacement of the moving vehicle.

2. The system of claim 1, wherein eddy viscosity and flow velocity are to simulate stability of the moving vehicle while the vehicle is moving in a presence of wind.

3. The system of claim 1, wherein the system is to simulate moving of at least one of air or fluid past the moving vehicle.

4. The system of claim 1, wherein the processor is configured to use the constraint-based immersed boundary method to predict a velocity of the moving vehicle based on a determination of engine load for the moving vehicle.

5. The system of claim 1, further including a turbulence modeler to generate a turbulence model using the detached eddy simulation at high Reynolds numbers for the moving vehicle.

6. The system of claim 1, further including a surface mesh generator to generate and reformulate a surface mesh using constrained immersed boundary processing on a moving vehicle geometry.

7. A computer-implemented method to simulate and predict a velocity of a moving vehicle based on a determination of engine load for the vehicle, the method comprising:
    computing, using a processor, a nearest wall distance for the moving vehicle in an environment;
    solving, using the processor, an eddy viscosity for the environment using a constraint based immersed boundary method to determine a detached eddy simulation of the moving vehicle, wherein the environment is a fluid, and a pseudo-fluid occupying a location of the moving vehicle is constrained to be rigid;
    solving, using the processor, a flow velocity for the environment;
    determining, using the processor, the translational and rotational velocity of the moving vehicle based on the engine load and on the nearest wall distance, the eddy viscosity, and the flow velocity; and
    adjusting, by the processor, a rear slant angle of a vehicle design of the moving vehicle based at least in part on the determined translational and rotational velocity of the moving vehicle to reduce lateral displacement of the moving vehicle.

8. The method of claim 7, wherein eddy viscosity and flow velocity are to simulate stability of the moving vehicle while the vehicle is moving in a presence of wind.

9. The method of claim 7, wherein solving the eddy viscosity and solving the flow velocity utilize the constraint-based immersed boundary method to predict a velocity of the moving vehicle based on a determination of engine load for the moving vehicle.

10. The method of claim 7, wherein solving the flow velocity further includes leveraging a vehicle dynamics model to determine the flow velocity.

11. The method of claim 7, further including outputting an adjustment for at least one other parameter of vehicle design or vehicle configuration based on the determined translational and rotational velocity of the moving vehicle.

12. The method of claim 7, further including generating a turbulence model using the detached eddy simulation at high Reynolds numbers for the moving vehicle.

13. The method of claim 7, further includi nggenerating a surface mesh using constrained immersed boundary processing on a moving vehicle geometry.

14. A non-transitory tangible computer readable storage medium including instructions which, when executed by a processor, implement a method to simulate and predict a velocity of a moving vehicle based on a determination of engine load for the vehicle, the method comprising:
    computing a nearest wall distance for the moving vehicle in an environment;
    solving an eddy viscosity for the environment using a constraint based immersed boundary method to determine a detached eddy simulation of the moving vehicle, wherein the environment is a fluid, and a pseudo-fluid occupying a location of the moving vehicle is constrained to be rigid;
    solving a flow velocity for the environment;
    determining the translational and rotational velocity of the moving vehicle based on the engine load, and on the nearest wall distance, the eddy viscosity, and the flow velocity; and
    adjusting a rear slant angle of updating a vehicle design of the moving vehicle based at least in part on the determined translational and rotational velocity of the moving vehicle to reduce lateral displacement of the moving vehicle.

15. The non-transitory tangible computer readable storage medium of claim 14, wherein solvingthe eddy viscosityand solvingthe flow velocity utilize the constraint-based immersed boundary method to predict a velocity of the moving vehicle based on a determination of engine load for vehicle.

16. The non-transitory tangible computer readable storage medium of claim 14, wherein solvingthe flow velocity further includes leveraging a vehicle dynamics model to determine the flow velocity.

17. The non-transitory tangible computer readable storage medium of claim 14, wherein the method further includes generating a turbulence model using the detached eddy simulation at high Reynolds numbers for the moving vehicle.

* * * * *